(12) United States Patent
Okamoto et al.

(10) Patent No.: US 7,849,591 B2
(45) Date of Patent: Dec. 14, 2010

(54) METHOD OF MANUFACTURING A PRINTED WIRING BOARD

(75) Inventors: Masahiro Okamoto, Sakura (JP); Shouji Itou, Sakura (JP); Osamu Nakao, Sakura (JP); Takanao Suzuki, Sakura (JP); Satoshi Okude, Sakura (JP)

(73) Assignee: Fujikura Ltd., Tokyo (JP)

( * ) Notice: Subject to any disclaimer, the term of this patent is extended or adjusted under 35 U.S.C. 154(b) by 239 days.

(21) Appl. No.: 12/089,480

(22) PCT Filed: Oct. 13, 2006

(86) PCT No.: PCT/JP2006/320437

§ 371 (c)(1),
(2), (4) Date: Apr. 7, 2008

(87) PCT Pub. No.: WO2007/043639

PCT Pub. Date: Apr. 19, 2007

(65) Prior Publication Data

US 2009/0154132 A1    Jun. 18, 2009

(30) Foreign Application Priority Data

Oct. 14, 2005  (JP) ............................. 2005-300324
Feb. 23, 2006  (JP) ............................. 2006-047538
Apr. 28, 2006  (JP) ............................. 2006-125728

(51) Int. Cl.
*H05K 3/30*    (2006.01)
*H05K 1/16*    (2006.01)

(52) U.S. Cl. ............................. 29/832; 29/830; 29/831; 29/846; 29/852; 174/260

(58) Field of Classification Search .................. 29/830, 29/831, 832, 852, 846, 746; 361/804, 820, 361/813, 807, 808; 156/228, 345.47, 380.3, 156/380.4; 438/470, 462, 412; 174/260, 174/261, 262, 252, 255
See application file for complete search history.

(56) References Cited

U.S. PATENT DOCUMENTS 4,544,989 A * 10/1985 Nakabu et al. ............... 361/764

(Continued)

FOREIGN PATENT DOCUMENTS

JP        6-326438 A    11/1994

(Continued)

*Primary Examiner*—Derris H Banks
*Assistant Examiner*—Tai Nguyen
(74) *Attorney, Agent, or Firm*—Sughrue Mion, PLLC

(57) ABSTRACT

A configuration according to the invention includes at least one wired base material configured with an insulating base material having an adhesion property, and an electric conductive layer formed on one side of the insulating base material, a plugging electrode made of an electric conductive paste, connected to the electric conductive layer, and penetrating the insulating base material, and an IC chip having a re-wiring portion, the IC chip being buried in an interlayer binding material, with the re-wiring portion connected to the plugging electrode, having a supporting board disposed on an opposite side to the re-wiring portion of the IC chip, with an adhesion layer in between, and having a re-wiring layer configured with the wired base material and the re-wiring portion.

According to the invention, therefore, it is allowed to provide a multi-layer printed wing board with highly defined components implemented, allowing for a fabrication by facile processes, without causing, among others, increased costs or decreased yields.

8 Claims, 26 Drawing Sheets

U.S. PATENT DOCUMENTS

| | | | |
|---|---|---|---|
| 6,190,957 B1 * | 2/2001 | Mochizuki et al. | 438/240 |
| 6,323,439 B1 * | 11/2001 | Kambe et al. | 174/262 |
| 6,476,503 B1 * | 11/2002 | Imamura et al. | 257/780 |

FOREIGN PATENT DOCUMENTS

| | | |
|---|---|---|
| JP | 2000-49460 A | 2/2000 |
| JP | 2001-44641 A | 2/2001 |
| JP | 2002-246756 A | 8/2002 |
| JP | 2002-270712 A | 9/2002 |
| JP | 2003-17859 A | 1/2003 |
| JP | 2003-318546 A | 11/2003 |
| JP | 2004-95836 A | 3/2004 |
| JP | 2004-152963 A | 5/2004 |
| JP | 2004-266094 A | 9/2004 |
| JP | 2005-150344 A | 6/2005 |

* cited by examiner

PRIOR ART

FIG. 5
(a) 
(b) 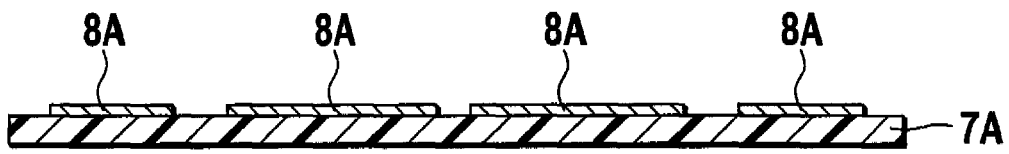
(c) 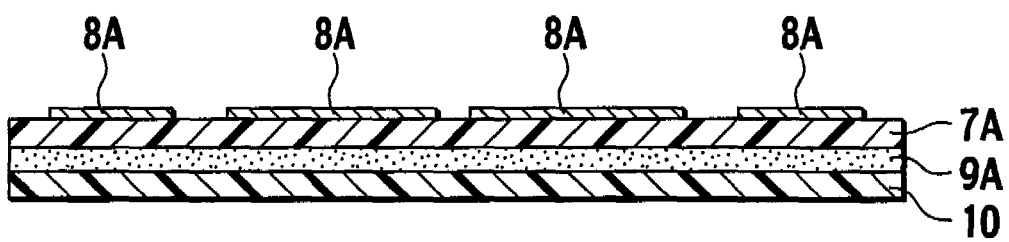
(d) 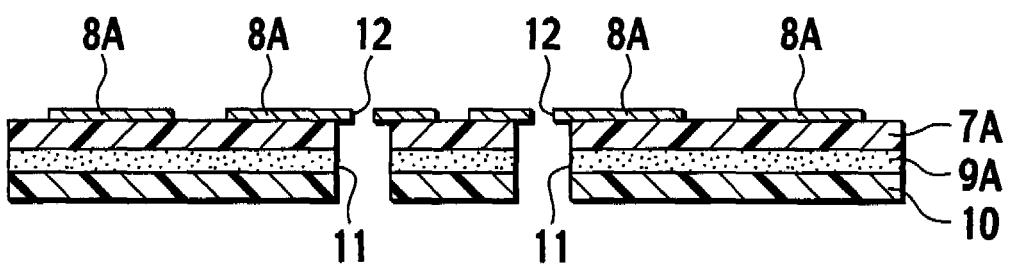
(e) 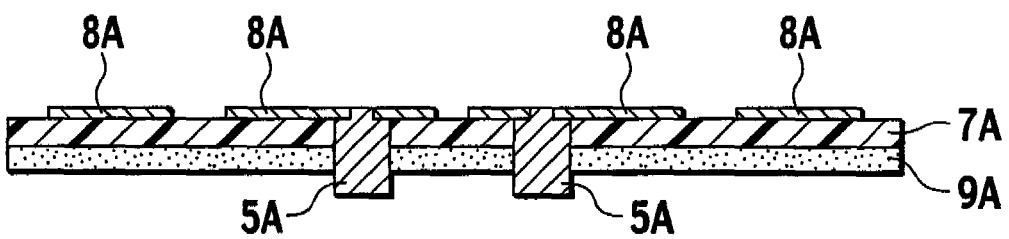
(f) 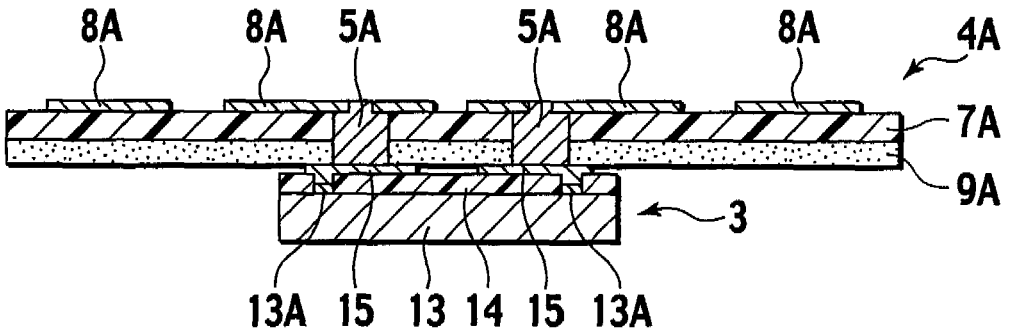

FIG. 12
(a)
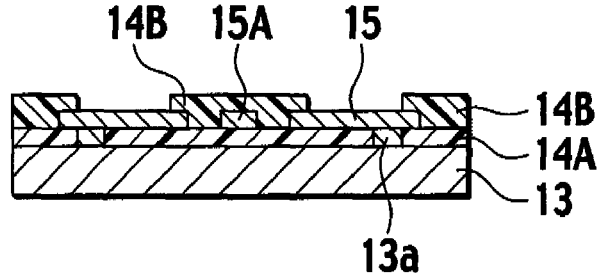
(b)
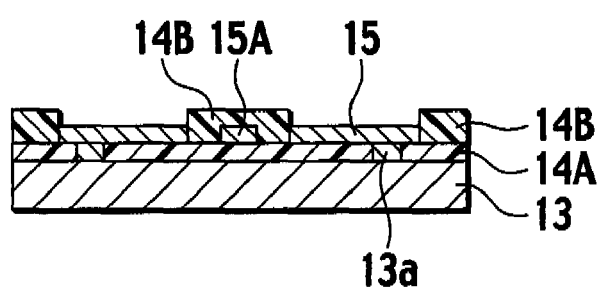
(c)
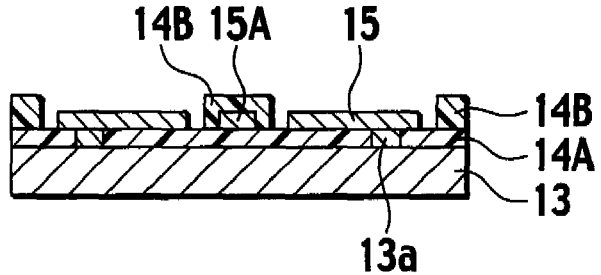

FIG. 16
(a)
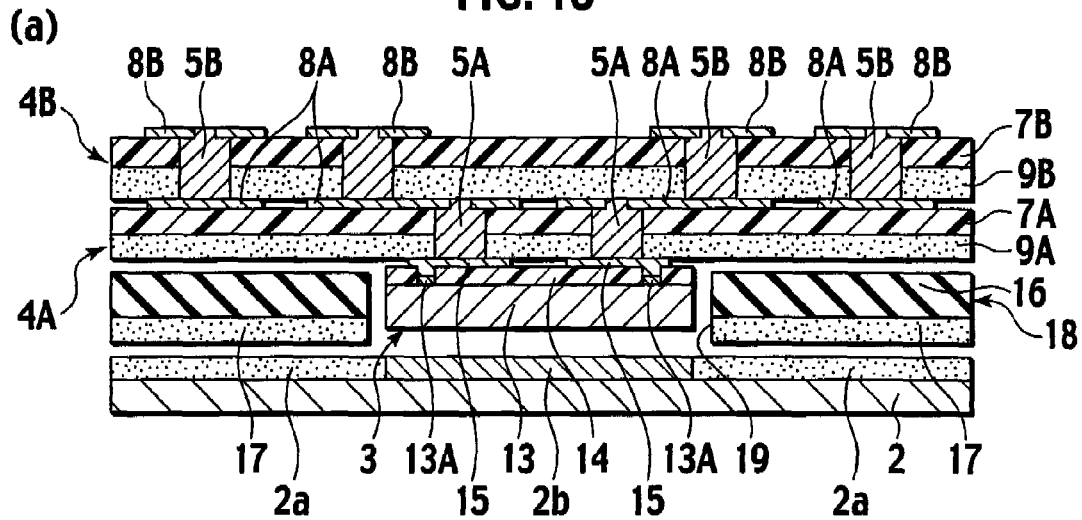
(b)
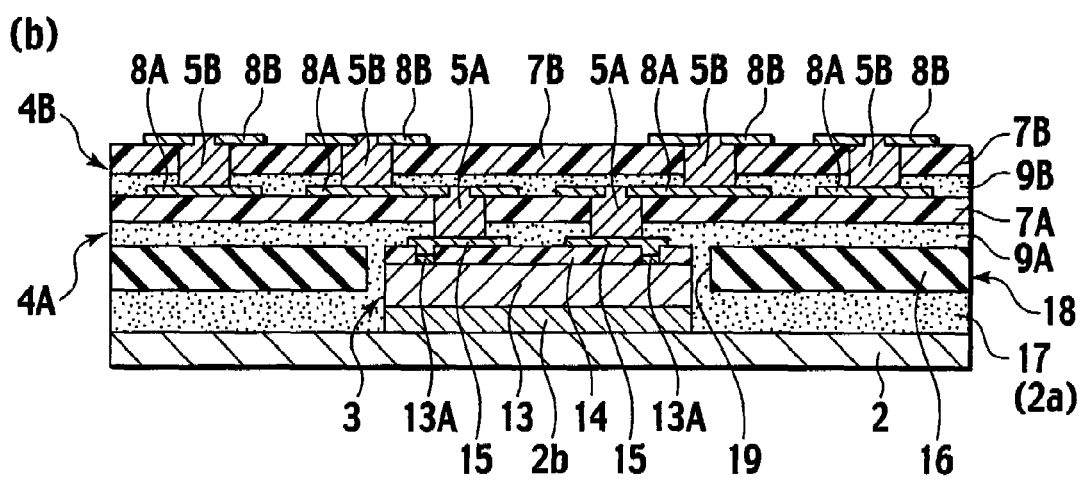
(c)
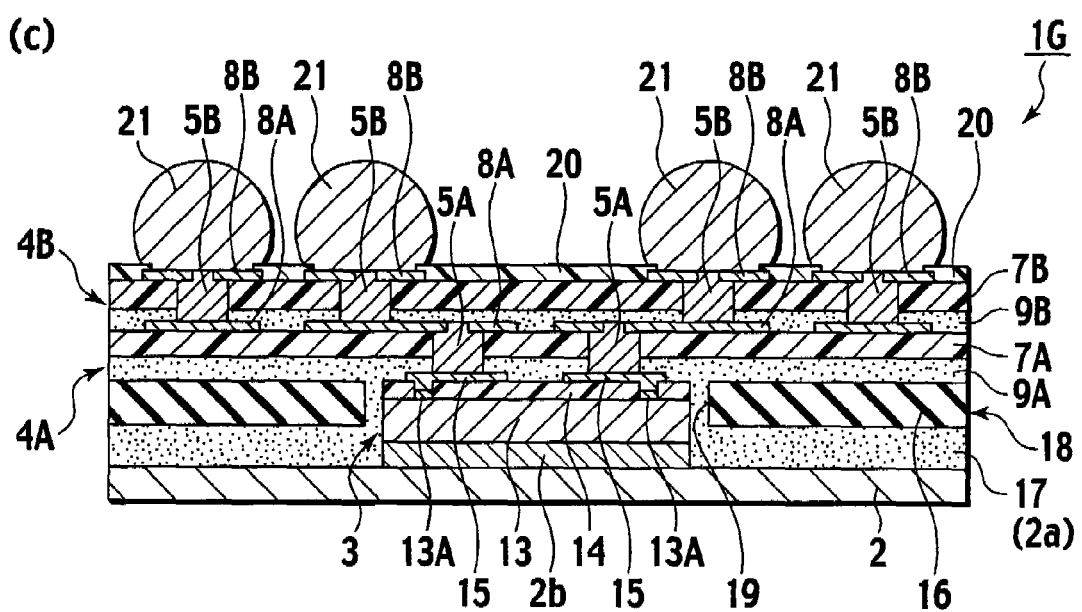

FIG. 25
(a)
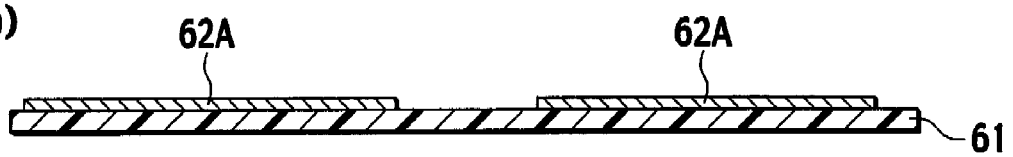
(b)
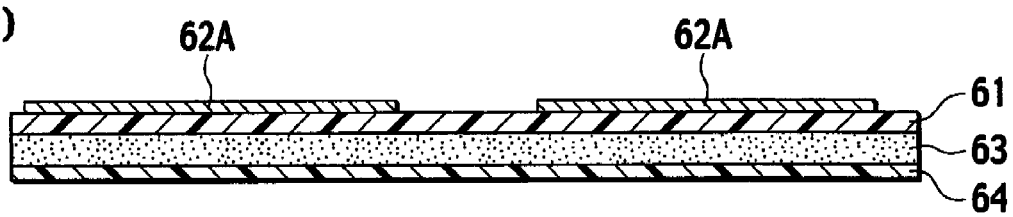
(c)
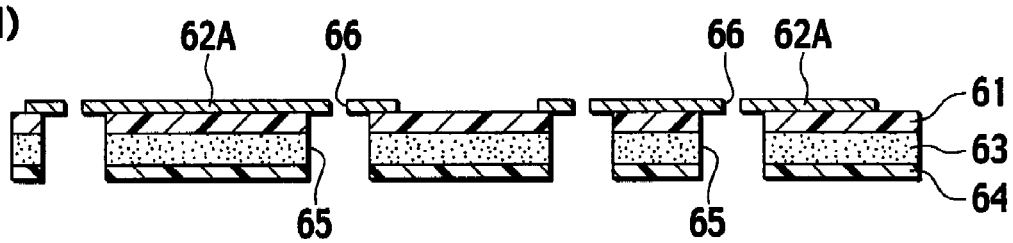
(d)
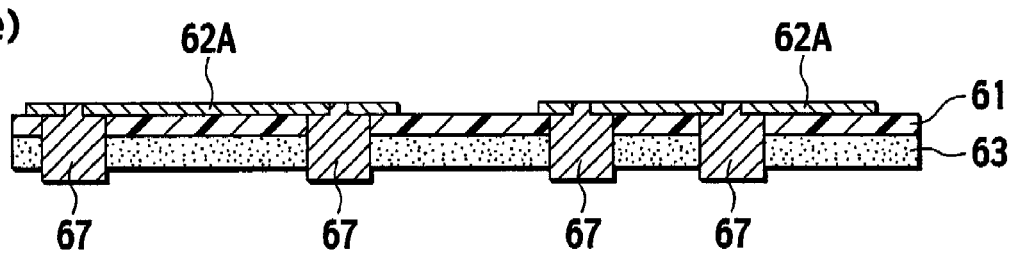
(e)
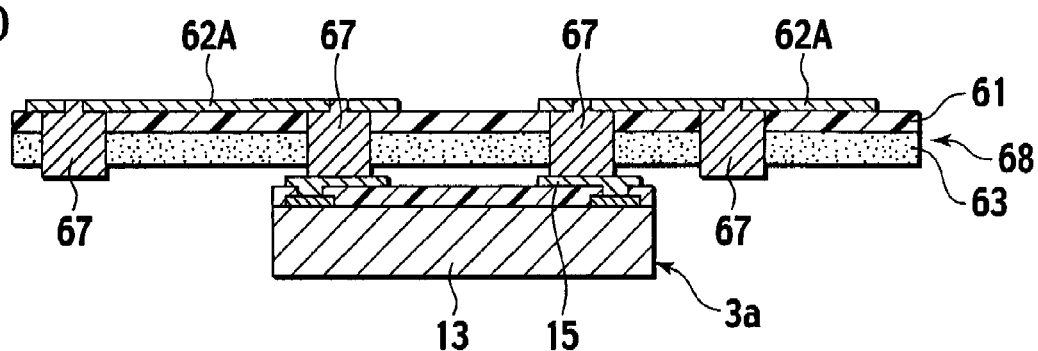
(f)

FIG. 30
(a)
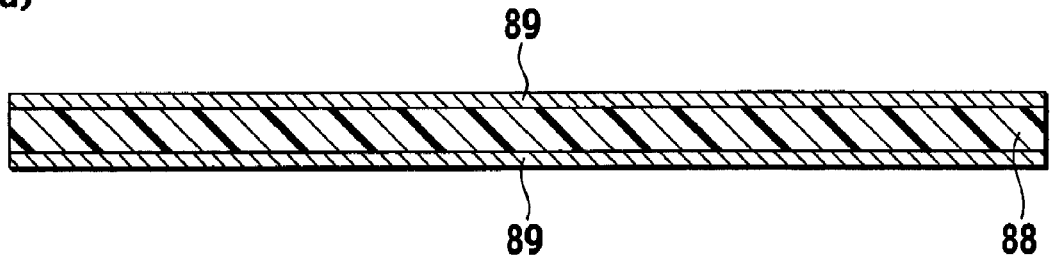
(b)
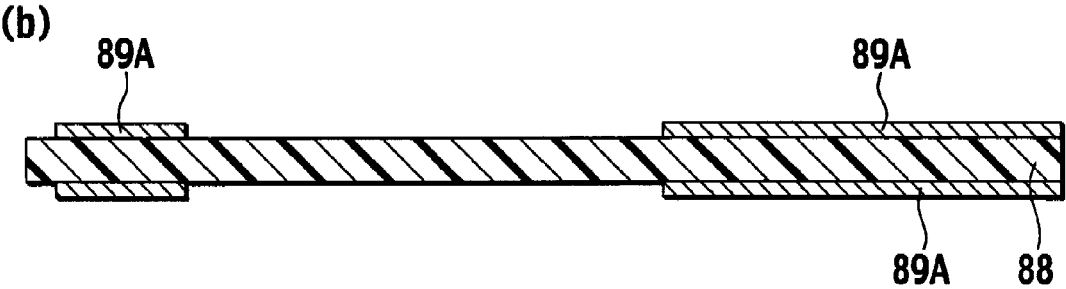
(c)
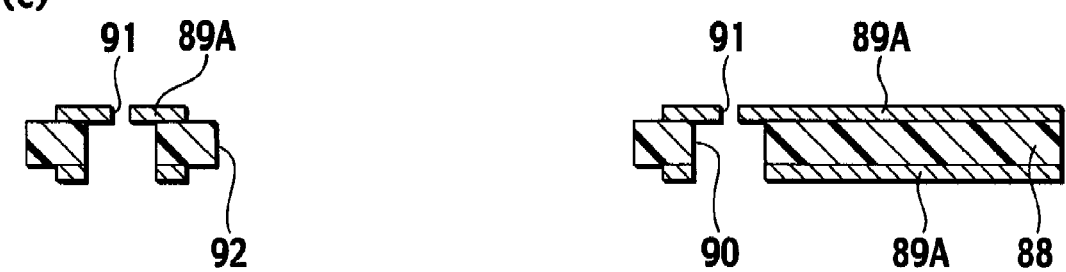
(d)
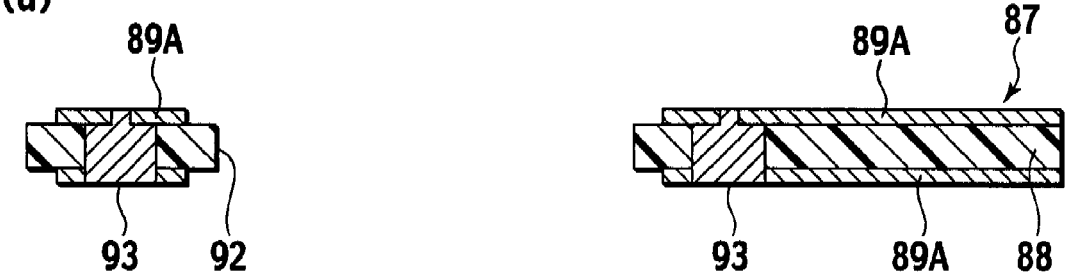

METHOD OF MANUFACTURING A PRINTED WIRING BOARD

TECHNICAL FIELD

The present invention relates to a multi-layer wiring board having two or more wiring layers, with components such as IC or sensor inclusive, and particularly, to a printed wiring board that allows for a significant enhancement in wiring layer productivity, as well as a method of manufacturing a printed wiring board.

BACKGROUND ART

In the past, there were package boards employed for an electrical connection between a device manufactured in a wafer process and external circuitry or apparatus to effect transmission of signals from the device, as well as supply of external power to the device. Package boards employed in the past included, as shown in FIG. 1, a diced piece of IC chip 101 mounted on a board 103 greater than the IC chip and formed with a re-wiring layer 102, with connections, such as by gold wires 104, between the IC chip 101 and the re-wiring layer 102.

Moreover, in the past, there was employed also a package system in which, as shown in FIG. 2, a bare chip IC 101 having metal bumps 105 formed thereon was implemented on a board formed with a re-wiring layer 102, using an anisotropic conductive adhesive 106.

However, along with functional multiplication in recent mobile electronics, semiconductor devices also have faced needs for additional miniaturization, most of which have been focused on miniaturization of a package, rather than high integration of ICs.

Recent years have observed development of a wafer-level chip-scale package (referred herein to "WLCSP") as an ultimate miniature package made simply by a build-up method. As shown in FIG. 3, the WLCSP has a direct wiring (re-wiring layer 102) formed by a build-up method, on an IC 101, using a silicon wafer 101 as a base, and is a minimal package having a package size equal to a chip size.

However, the number of terminals to be arranged on a package is limited by a rule on the terminal pitch of boards to be implemented, and the application of WLCSP is restricted to such devices that have a small number of pins. As a technique for expansion against such a restricted situation of WLCSP, there has been proposed a chip built-in board. For the chip built-in board, an IC chip mounted on a board has a re-wiring layer built simply by build-up techniques.

Like the above-noted chip built-in board, there are coreless wiring boards to be formed simply by a build-up method, which are well-suited as boards for connection of such devices that have fine wirings fabricated by a technique of wafer process. However, the fabrication process costs very high in comparison with a typical printed board, i.e., such one that has circuits fabricated by etching copper foils and multi-layered by adhesion. Further, the chip built-in board has as many processes as the number of necessary wiring layers, to be executed in series, requiring a long term for fabrication, and the yield also has a decreasing tendency, as it corresponds to as much accumulation as the number of processes.

Further, for multi-layer boards using polyimide as bases and multi-layered by stacking their wirings, although it is possible to make highly defined wirings in a layer, the connection between layers depends on a mechanical positioning precision. In such a multi-layer board, therefore, the inter-layer connection needs a design in consideration of alignment errors between layers, with a resultant restriction to the pitch of vias (plugging electrodes).

DISCLOSURE OF INVENTION

It is an object of the present invention to provide a multi-layer printed wiring board having highly defined components implemented, allowing for fabrication by facile processes, without causing, among others, increased costs or decreased yields. It also is an object to provide a method of manufacturing such a printed wiring board.

As described, wiring boards of a structure to be formed simply by a build-up method, such as a chip built-in board, have many processes, and cost high. On the other hand, for boards allowing chip implementation, though micro-fabrication in a layer is possible, the dependency on precision of alignment that they have, when multi-layered, will constitute a difficulty for a highly defined one.

In this respect, according to the present invention, a printed wiring board has any one of the following configurations, whereby it is allowed to provide a multi-layer printed wiring board with highly defined components implemented, with facile processes.

[Configuration 1]

According to an aspect of the present invention, a printed wiring board comprises at least one wired base material configured with an insulating base material having an adhesion property, and an electric conductive layer formed on one side of the insulating base material, a plugging electrode made of an electric conductive paste, connected to the electric conductive layer of the wired base material, penetrating the insulating base material, and fronting another side of the insulating base material, and a semiconductor device having a re-wiring portion connected to an electrode formed on a semiconductor substrate, the semiconductor device being buried in the insulating base material of the wired base material, with the re-wiring portion connected to the plugging electrode, having a re-wiring layer configured with the wired base material and the re-wiring portion of the semiconductor device.

With this configuration, it is allowed to provide a multi-layer wiring board with highly defined components implemented, with facile processes.

[Configuration 2]

According to an aspect of the present invention, a printed wiring board comprises at least one wired base material configured with an insulating base material, and an electric conductive layer formed on one side of the insulating base material, an adhesion layer formed on another side of the insulating base material, a plugging electrode made of an electric conductive paste, connected to the electric conductive layer of the wired base material, penetrating the insulating base material and the adhesion layer, and fronting the other side of the insulating base material, and a semiconductor device having a re-wiring portion connected to an electrode formed on a semiconductor substrate, the semiconductor device being buried in the adhesion layer, with the re-wiring portion connected to the plugging electrode, having a re-wiring layer configured with the wired base material and the re-wiring portion of the semiconductor device.

With this configuration, it is allowed to provide a multi-layer wiring board with highly defined components implemented, with facile processes.

[Configuration 3]

According to an aspect a printed wiring board has the [configuration 1] or the [configuration 2], wherein it comprises a supporting board opposing the wired base material, with the semiconductor device in between, and a spacer disposed between the supporting board and the wired base material, within a region excepting an installation region of the semiconductor device.

With this configuration, which includes the supporting board and the spacer, it is allowed to suppress flowage of the adhesion layer or the insulating base material, allowing for a reduced warpage.

Further, according to the present invention, a printed wiring board and a manufacturing method will be arranged as following, allowing for facile processes to manufacture a multi-layer printed wiring board with highly defined components implemented.

[Configuration 4]

According to an aspect of the present invention, a printed wiring board comprises at least one wired base material configured with an insulating base material having an adhesion property, and an electric conductive layer formed on one side of the insulating base material, a plugging electrode made of an electric conductive paste, connected to the electric conductive layer of the wired base material, penetrating the insulating base material, and fronting another side of the insulating base material, and a semiconductor device having a re-wiring portion connected to an electrode formed on a semiconductor substrate, the semiconductor device being buried in the insulating base material of the wired base material, with the re-wiring portion connected to the plugging electrode, having a supporting board disposed on an opposite side to the re-wiring portion of the semiconductor device, with an adhesion layer in between, and having a re-wiring layer configured with the wired base material and the re-wiring portion of the semiconductor device.

With this configuration, it is allowed to provide a multi-layer wiring board with highly defined components implemented, with facile processes. Further, by provision of the supporting board, it is allowed to suppress flowage of the adhesion layer or the insulating base material, allowing for a reduced warpage.

[Configuration 5]

According to an aspect of the present invention, a printed wiring board comprises at least one wired base material configured with an insulating base material, and an electric conductive layer formed on one side of the insulating base material, an adhesion layer formed on another side of the insulating base material, a plugging electrode made of an electric conductive paste, connected to the electric conductive layer of the wired base material, penetrating the insulating base material and the adhesion layer, and fronting the other side of the insulating base material, and a semiconductor device having a re-wiring portion connected to an electrode formed on a semiconductor substrate, the semiconductor device being buried in the adhesion layer, with the re-wiring portion connected to the plugging electrode, having a supporting board disposed on an opposite side to the re-wiring portion of the semiconductor device, with an adhesion layer in between, and having a re-wiring layer configured with the wired base material and the re-wiring portion of the semiconductor device.

With this configuration, it is allowed to provide a multi-layer wiring board with highly defined components implemented, with facile processes. Further, by provision of the supporting board, it is allowed to suppress flowage of the adhesion layer or the insulating base material, allowing for a reduced warpage.

[Configuration 6]

According to an aspect of the present invention, a printed wiring board comprises at least one wired base material configured with an insulating base material having an adhesion property, and an electric conductive layer formed on one side of the insulating base material, a plugging electrode made of an electric conductive paste, connected to the electric conductive layer of the wired base material, penetrating the insulating base material, and fronting another side of the insulating base material, and a semiconductor device having a re-wiring portion connected to an electrode formed on a semiconductor substrate, the semiconductor device being buried in the insulating base material of the wired base material, with the re-wiring portion connected to the plugging electrode, having a supporting board disposed on an opposite side to the re-wiring portion of the semiconductor device, with an adhesion layer put in between, the adhesion layer containing at least in part a heat conductive material of a heat conductivity of 0.4 W/m·K or more, and having a re-wiring layer configured with the wired base material and the re-wiring portion of the semiconductor device.

With this configuration, it is allowed to provide a multi-layer wiring board with highly defined components implemented, with facile processes. Further, by provision of the supporting board, it is allowed to suppress flowage of the adhesion layer or the insulating base material, allowing for a reduced warpage.

[Configuration 7]

According to an aspect of the present invention, a printed wiring board comprises at least one wired base material configured with an insulating base material, and an electric conductive layer formed on one side of the insulating base material, an adhesion layer formed on another side of the insulating base material, a plugging electrode made of an electric conductive paste, connected to the electric conductive layer of the wired base material, penetrating the insulating base material and the adhesion layer, and fronting the other side of the insulating base material, and a semiconductor device having a re-wiring portion connected to an electrode formed on a semiconductor substrate, the semiconductor device being buried in the adhesion layer, with the re-wiring portion connected to the plugging electrode, having a supporting board disposed on an opposite side to the re-wiring portion of the semiconductor device, with an adhesion layer put in between, the adhesion layer containing at least in part a heat conductive material of a heat conductivity of 0.4 W/m·K or more, and having a re-wiring layer configured with the wired base material and the re-wiring portion of the semiconductor device.

With this configuration, it is allowed to provide a multi-layer wiring board with highly defined components implemented, with facile processes. Further, by provision of the supporting board, it is allowed to suppress flowage of the adhesion layer or the insulating base material, allowing for a reduced warpage.

[Configuration 8]

According to an aspect, a printed wiring board has any of the [configuration 4] to the [configuration 7], wherein it comprises a spacer disposed between the supporting board and the wired base material, within a region excepting an installation region of the semiconductor device.

With this configuration, it is allowed to suppress flowage of the adhesion layer or the insulating base material, allowing for a reduced warpage.

[Configuration 9]

According to an aspect, a printed wiring board has any one of the [configuration 1] to the [configuration 8], wherein it comprises a plurality of wired base materials, and a plugging electrode interconnecting electric conductive layers of the wired base materials, wherein the plugging electrode interconnecting the electric conductive layers of the wired base materials and the plugging electrode interconnecting the electric conductive layer of said one wired base material and the rewiring portion of the semiconductor device are made of an identical material.

With this configuration, a plugging electrode employed for interlayer connection of and between wired base materials and a plugging electrode for connection with a semiconductor device are to be made of an identical material, allowing for a facilitated manufacture.

[Configuration 10]

According to an aspect of the present invention, a printed wiring board comprises at least one first wired base material configured with an insulating base material, and an electric conductive layer formed on one side of the insulating base material, a first plugging electrode made of an electric conductive paste, connected to the electric conductive layer of the first wired base material, penetrating the insulating base material, and fronting another side of the insulating base material, at least one second wired base material configured with an insulating base material, and an electric conductive layer formed on another side of this insulating base material, a second plugging electrode connected to the electric conductive layer of the second wired base material, penetrating the insulating base material of the second wired base material, and electrically connected to the electric conductive layer of the first wired base material, and a semiconductor device having a re-wiring portion connected to an electrode formed on a semiconductor substrate, the semiconductor device being interposed between the first wired base material and the second wired base material, having the re-wiring portion connected to the first plugging electrode, and having a re-wiring layer configured with the first wired base material and the re-wiring portion of the semiconductor device.

With this configuration, it is allowed to have terminals arranged on the first and second wired base materials, with the semiconductor device in between, allowing for an enhanced density of implementation.

Further, according to the present invention, a method of manufacturing a printed wiring board has any one of the following configurations, whereby it is allowed to manufacture a multi-layer printed wiring board with highly defined components implemented, with facile processes.

[Configuration 11]

According to an aspect of the present invention, a method of manufacturing a printed wiring board comprises a set of steps of forming a via hole in an insulating base material made of a resin having a thermal plasticity or a thermo-set resin in a partially cured state and having an electric conductive layer formed on one side thereof, and filing the via hole with an electric conductive paste in a printing manner to make a plugging electrode, a set of steps of positioning to the plugging electrode a re-wiring portion of a semiconductor device having the re-wiring portion connected to an electrode formed on a semiconductor board, and provisionally joining the semiconductor device to an adhesion layer of the insulating base material by a thermo-compression bonding, and a step of performing an adhesive bonding between insulating base materials, an adhesive bonding of the insulating base material and the semiconductor device, and a hardening of the electric conductive paste to make the plugging electrode, by a hot pressing as a single step.

[Configuration 12]

According to an aspect of the present invention, a method of manufacturing a printed wiring board comprises a set of steps of forming a via hole in an insulating base material having an electric conductive layer on one side thereof and an adhesion layer as another side thereof, and filling the via hole with an electric conductive paste in a printing manner to make a plugging electrode, a set of steps of positioning to the plugging electrode a re-wiring portion of a semiconductor device having the re-wiring portion connected to an electrode formed on a semiconductor substrate, and provisionally joining the semiconductor device to the adhesion layer of the insulating base material by a thermo-compression bonding, and a step of performing an adhesive bonding between insulating base materials, an adhesive bonding of the insulating base material and the semiconductor device, and a hardening of the electric conductive paste to make the plugging electrode, by a hot pressing as a single step.

[Configuration 13]

According to an aspect of the present invention, a method of manufacturing a printed wiring board comprises a set of steps of forming a via hole in an insulating base material made of a resin having a thermal plasticity or a thermo-set resin in a partially cured state and having an electric conductive layer formed on one side thereof, and filing the via hole with an electric conductive paste in a printing manner to make a plugging electrode, a set of steps of positioning to the plugging electrode a rewiring portion of a semiconductor device having the re-wiring portion connected to an electrode formed on a semiconductor substrate, disposing a supporting board formed with an adhesion layer on an opposite side to the re-wiring portion of the semiconductor device, with the adhesion layer brought into contact thereon, and provisionally joining the semiconductor device to an adhesion layer of the insulating base material by a thermo-compression bonding, and a step of performing an adhesive bonding between insulating base materials, an adhesive bonding of the insulating base material and the semiconductor device, and a hardening of the electric conductive paste to make the plugging electrode, by a hot pressing as a single step.

[Configuration 14]

According to an aspect of the present invention, a method of manufacturing a printed wiring board comprises a set of steps of forming a via hole in an insulating base material having an electric conductive layer on one side thereof and an adhesion layer as another side thereof, and filling the via hole with an electric conductive paste in a printing manner to make a plugging electrode, a set of steps of positioning to the plugging electrode a re-wiring portion of a semiconductor device having the re-wiring portion connected to an electrode formed on a semiconductor substrate, disposing a supporting board formed with an adhesion layer on an opposite side to the re-wiring portion of the semiconductor device, with this adhesion layer brought into contact thereon, and provisionally joining the semiconductor device to the adhesion layer of the insulating base material by a thermo-compression bonding, and a step of performing an adhesive bonding between insulating base materials, an adhesive bonding of the insulating base material and the semiconductor device, and a hardening of the electric conductive paste to make the plugging electrode, by a hot pressing as a single step.

[Configuration 15]

According to an aspect of the present invention, a method of manufacturing a printed wiring board comprises a set of steps of forming a via hole in an insulating base material made of a resin having a thermal plasticity or a thermo-set resin in a partially set state and having an electric conductive layer formed on one side thereof, and filling the via hole with an electric conductive paste in a printing manner to make a plugging electrode, a set of steps of positioning to the plugging electrode a re-wiring portion of a semiconductor device having the re-wiring portion connected to an electrode formed on a semiconductor substrate, disposing a supporting board formed with an adhesion layer containing at least in part a heat conductive material of a heat conductivity of 0.4 W/m·K or more on an opposite side to the re-wiring portion of the semiconductor device, with the adhesion layer brought into contact thereon, and provisionally joining the semiconductor device to an adhesion layer of the insulating base material by a thermo-compression bonding, and a step of performing an adhesive bonding between insulating base materials, an adhesive bonding of the insulating base material and the semiconductor device, and a hardening of the electric conductive paste to make the plugging electrode, by a hot pressing as a single step.

[Configuration 16]

According to an aspect of the present invention, a method of manufacturing a printed wiring board comprises a set of steps of forming a via hole in an insulating base material having an electric conductive layer on one side thereof and an adhesion layer as another side thereof, and filling the via hole with an electric conductive paste in a printing manner to make a plugging electrode, a set of steps of positioning to the plugging electrode a re-wiring portion of a semiconductor device having the re-wiring portion connected to an electrode formed on a semiconductor substrate, disposing a supporting board formed with an adhesion layer containing at least in part a heat conductive material of a heat conductivity of 0.4 W/m·K or more on an opposite side to the re-wiring portion of the semiconductor device, with this adhesion layer brought into contact thereon, and provisionally joining the semiconductor device to the adhesion layer of the insulating base material by a thermo-compression bonding, and a step of performing an adhesive bonding between insulating base materials, an adhesive bonding of the insulating base material and the semiconductor device, and a hardening of the electric conductive paste to make the plugging electrode, by a hot pressing as a single step.

[Configuration 17]

According to an aspect of the present invention, a method of manufacturing a printed wiring board comprises a set of steps of forming a via hole in a first insulating base material having an electric conductive layer on one side thereof, and filling the via hole with an electric conductive paste in a printing manner to make a plugging electrode, a set of steps of positioning, to the plugging electrode, a re-wiring portion of a semiconductor device having the re-wiring portion connected to an electrode formed on a semiconductor substrate, and provisionally joining, by a thermo-compression bonding, the semiconductor device to the first insulating base material, with an interlayer binding material in between, a set of steps of forming a via hole in a second insulating base material having an electric conductive layer on another side thereof, and fling this via hole with an electric conductive paste in a printing manner to make a plugging electrode, a step of laminating the second insulating base material to the first insulating base material, with an interlayer binding material in between, having the semiconductor device interposed between the insulating base materials, bringing the plugging electrodes of the insulating base materials into contact with each other, and a step of performing an adhesive bonding by the interlayer binding materials, and a hardening of the electric conductive pastes to make the plugging electrodes, by a hot pressing as a single step.

BRIEF DESCRIPTION OF DRAWINGS

In FIG. 5, (a) to (f) are sections by steps illustrating a method of manufacturing the printed wiring board according to the first embodiment of the present invention.

In FIG. 12, (a) to (c) are sections by steps illustrating a method of manufacturing an IC chip to be built in the printed wiring board according to the fourth embodiment of the present invention.

In FIG. 16, (a) to (c) are sections by steps illustrating respective steps (steps in a latter half) of a method of manufacturing the printed wiring board according to the seventh embodiment of the present invention.

In FIG. 25, (a) to (f) are sections by steps illustrating a method of manufacturing a printed wiring board according to a thirteenth embodiment of the present invention.

In FIG. 30, (a) and (d) are sections by steps illustrating a method of manufacturing a cable wiring board in accordance with the fourteenth embodiment of the present invention.

BEST MODE FOR CARRYING OUT THE INVENTION

There will be described below best modes for carrying out the invention with reference to the drawings.

First Embodiment

Figure 1:
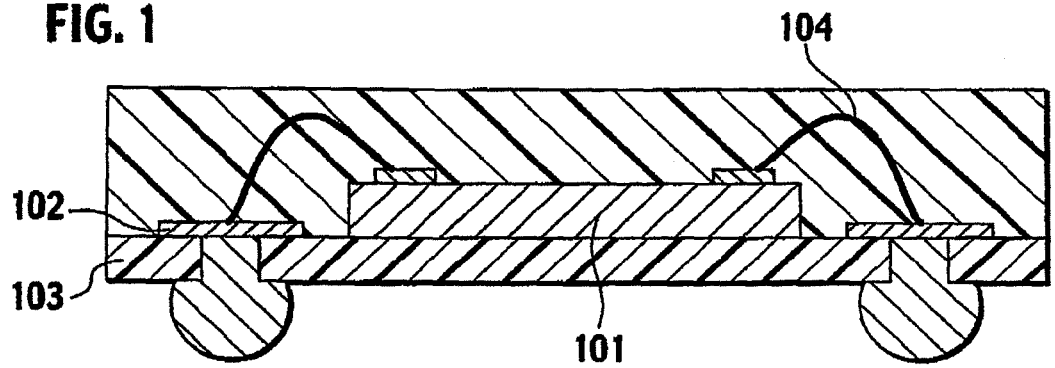
FIG. 1 is a configuration illustrating sectional view of a printed wiring board in the past.
Figure 2:
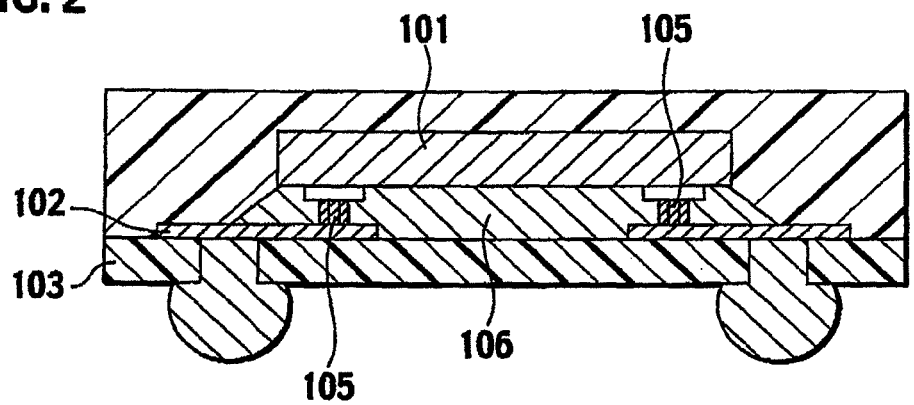
FIG. 2 is a configuration illustrating sectional view of another printed wiring board in the past.
Figure 3:
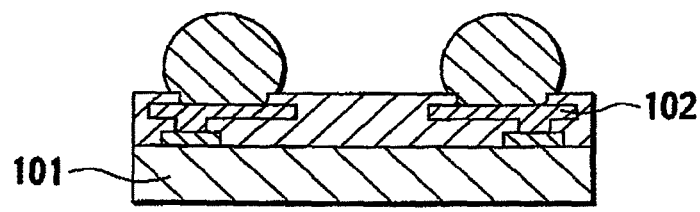
FIG. 3 is a configuration illustrating sectional view of still another printed wiring board in the past.
Figure 4:
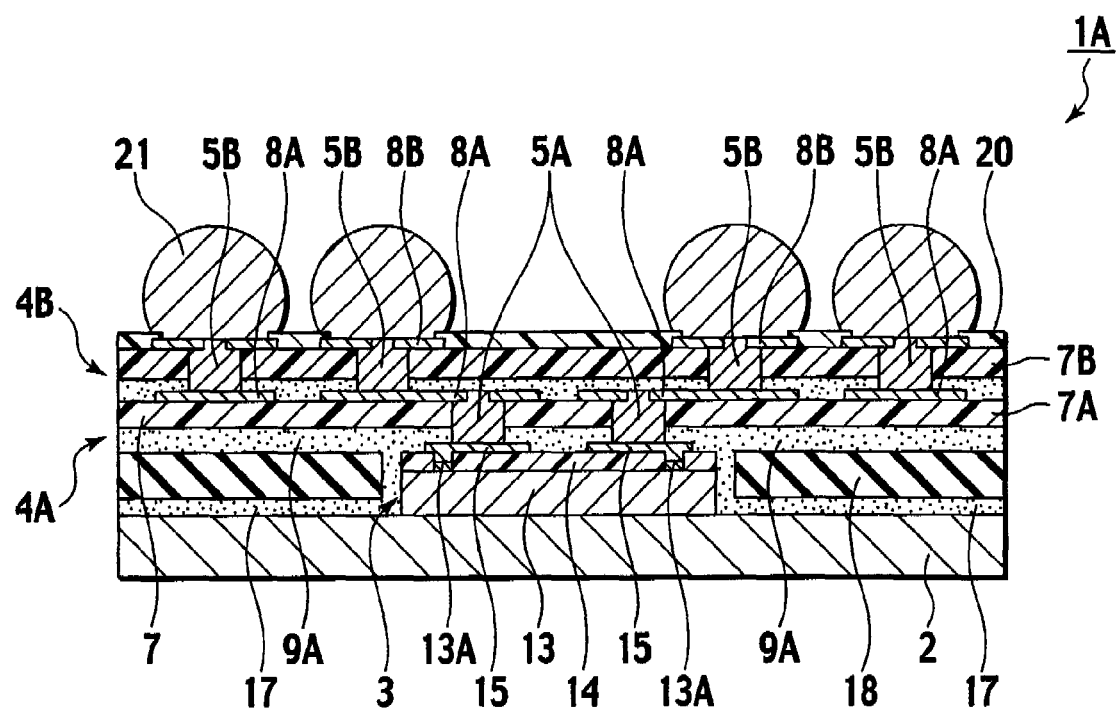
FIG. 4 is a configuration illustrating sectional view of a printed wiring board according to a first embodiment of the present invention.

FIG. 4 is a configuration illustrating sectional view of a printed wiring board 1A according to a first embodiment of the present invention.

In accordance with the present invention, the printed wiring board (a multi-layer wiring board) 1A is configured, as illustrated in FIG. 4, generally by laminating wired base materials 4A, 4B individually fabricated in advance, on an IC chip 3 as a semiconductor device formed with an electric conductive layer (an IC re-wiring layer) 15 constituting a re-wiring portion that forms part of a re-wiring layer and installed on a supporting board 2, and making them multi-layered all at once.

The electric conductive layer 15 formed on the IC chip 3 and the wired base material 4A are interconnected by plugging electrodes 5A having their pads for interlayer conduction made of an electric conductive paste, constituting a re-wiring portion. Further, the IC chip 3 is buried in an insulating base material included in the wired base material 4A.

In FIG. 5, (a) to (f) are sections by steps illustrating respective steps (steps in a former half) of a method of manufacturing the printed wiring board 1A according to the present embodiment.

Description is now made of a manufacturing method of the printed wiring board, using FIG. 5.

[1]

As illustrated in FIG. 5(a), on a one-side copper clad laminate (referred hereinafter to CCL (Copper Clad Laminate)) in which a copper foil 8 that will make an electric conductive layer is provided on one side of an insulating layer 7A made of a polyimide resin film, there is given a photolithography, thereby forming an unshown etching resist, and thereafter, using an etchant consisting primarily of ferric chloride, a chemical etching is made, thereby forming a circuit pattern 8A, as illustrated in FIG. 5(b).

For this embodiment in the CCL in use, the insulating layer 7A has a thickness of 25 μm, and the copper foil 8 has a thickness of 12 μm. It is noted that as a CCL to be used, there may be such one as fabricated by a so-called casting method, in which a polyimide varnish is applied to a copper foil 8, and the varnish is hardened. And besides, as the CCL to be used, there may be, among others, a CCL in which on a polyimide resin film a seed layer is sputtered, and copper is grown by a plating, or a CCL in which a rolled or electrolytic copper film and a polyimide resin film are glued together by an adhesive agent.

Further, the insulating layer 7A in use may not necessarily be a polyimide resin film, and may be a plastic film such as a liquid crystal polymer. Further, the etchant in use may not necessarily primarily consist of ferric chloride, and may be an etchant consisting primarily of cupric chloride.

[2]

As illustrated in FIG. 5(c), of the CCL after the process [1] above, an opposite side to the circuit pattern 8A has an interlayer binding material 9A and a resin film 10 glued thereon by a hot pressing. The interlayer binding material 9A in use is an epoxy type thermo-set film binding material of a thickness of 25 μm, and the resin film 10 in use is a polyimide film of a thickness of 25 μm. For the hot pressing, in use is a vacuum laminator, whereby they are pressed for a gluing in a pressure-reduced atmosphere, at a temperature below a hardening temperature of the interlayer binding material 9, under a pressure of 0.3 MPa. The insulating layer 7A and the interlayer binding material 9A will constitute an insulating base material having an adhesion property. It is noted that, as an insulating layer 7A to be used, if this be such one by itself that is made of a resin having a thermal plasticity or a thermo-set resin in a partially set state and has an adhesion property, then it is unnecessary to have the interlayer binding material 9A glued together.

The interlayer binding material 9A in use here is not limited to an epoxy type thermo-set film binding material, and such a binding material as an acrylic type may be used, or it may be such a thermo-plastic binding material as represented by a thermo-plastic polyimide or the like. Further, the interlayer binding material 9A in use may not necessarily have a film form, and may be a varnish-like resin to be applied. Further, the resin film 10 in use may be a plastic film else than polyimide, such as a PET (polyethylene terephthalate) or a PEN (polyethylene naphthalate), or may be such a film as capable of adhesion as well as exfoliation by UV (ultraviolet ray) irradiation.

[3]

Next, as illustrated in FIG. 5(d), via holes 11 of a diameter of 100 μm are formed by a YAG laser through the above-noted insulating layer 7A, interlayer binding material 9A, and resin film 10, and small holes 12 of diameters about 30 µm are opened in the copper foil 8. Then, after a plasma desmear treatment by a $CF_4$ and $O_2$ mixed gas, as illustrated in FIG. 5(e), by a screen printing method, the via holes 11 and the small holes 12 are filled with an electric conductive paste to make plugging electrodes 5A, and thereafter the resin film 10 is exfoliated. In this situation, plugging electrodes 5A made of the print-filled electric conductive paste have their distal ends protruded from a surface of interlayer binding material 9A, as much as the thickness of exfoliated resin film 10, thus forming protrusions.

It is noted that the laser in use for formation of via holes 11 and small holes 12 may be a YAG laser or else, such as a carbon dioxide gas laser or an excimer laser. Further, via holes 11 and small holes 12 may be formed by a drill machining or chemical etching. For the plasma desmear treatment the gas in use is not limited to a $CF_4$ and $O_2$ mixed gas, and as a gas else, an inactive gas such as Ar may be used. Further, instead of such dry treatments, there may be a wet desmear treatment using a chemical solution. The electric conductive paste in use to make plugging electrodes 5 is, but not limited to, a paste containing at least one kind of metallic particles low of electric resistance and selective from among nickel, silver, and copper, and at least one kind of metallic particles low of melting point and selective from among tin, bismuth, indium, and lead, and having epoxy-based binder components mixed thereto.

[4]

Figure 6:
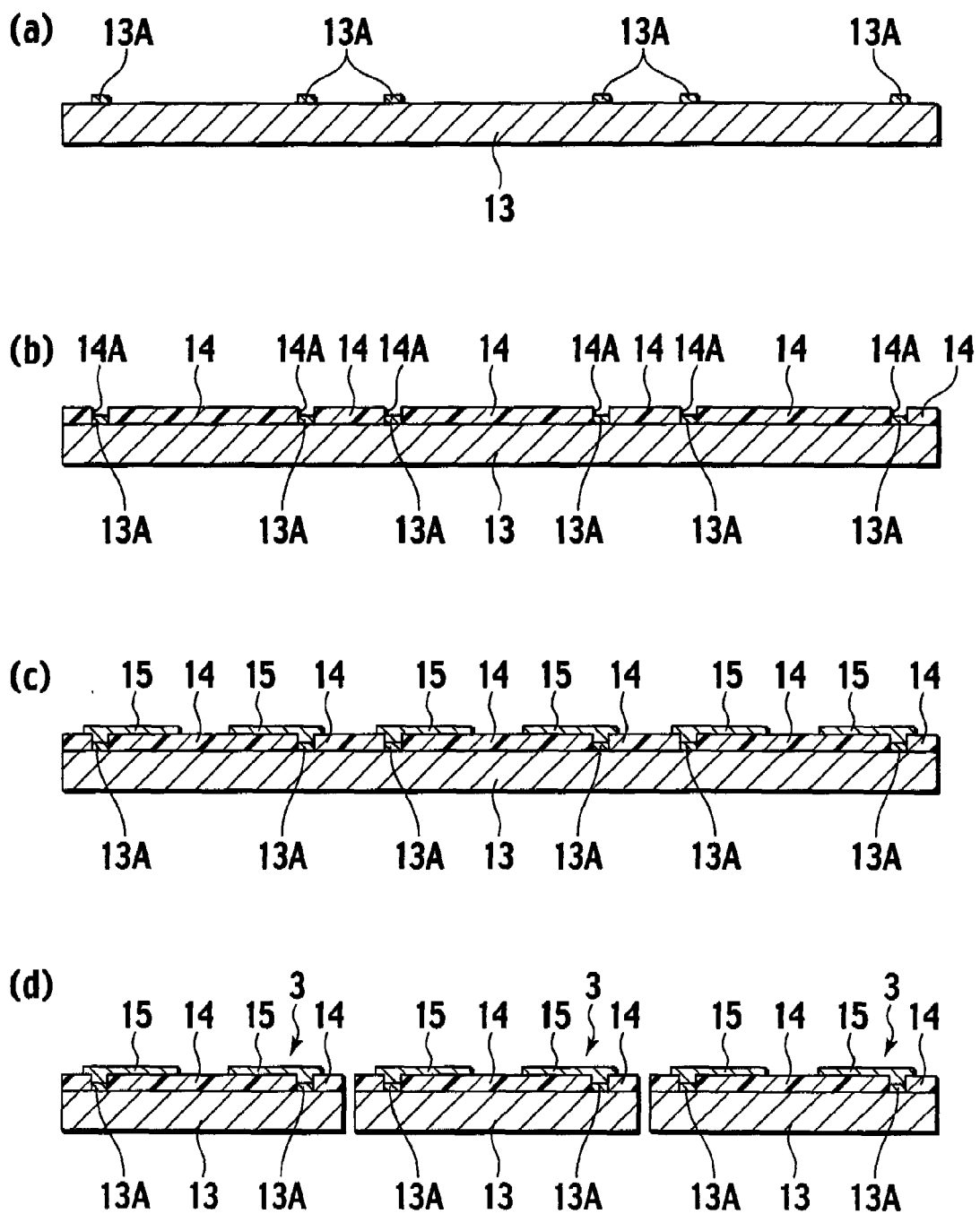
In FIG. 6, (a) to (d) are sections by steps illustrating a method of manufacturing an IC chip to be built in the printed wiring board according to the first embodiment of the present invention.

Given in FIG. 6 are sections illustrating an exemplary fabrication of IC chips.

Description is now made of an example of fabrication of an IC chip, with reference to FIG. 6. As illustrated in FIG. 6(a), on a surface of a semiconductor substrate 13 composed of a silicon wafer formed with pads 13A in respective chip regions for example, a photosensitive polyimide precursor in liquid form is spin-coated, and using a photolithography, contact holes 14A are formed above the pads 13A. And, as illustrated at (b) in FIG. 6, given a baking, an insulating layer 14 is formed.

Next, as illustrated in FIG. 6(c), using a semi-additive method, over the insulating layer 14 and inside contact holes, there is formed an electric conductive layer 15 that will constitute a re-wiring portion. After an inspection by a probing, as illustrated in FIG. 6(d), individual IC chips 3 are given as cut pieces by a dicing.

It is noted that in this embodiment, as a material for the insulating layer 14, although in use is a photosensitive polyimide precursor, which may be a material else, such as, among others, benzocyclobutene (CB) or polybenzoxazole (PBO). Further, the photosensitive resin may not always be applied by a spin coating, and there may well be a curtain coat a screen print a spray coat or such. In addition, the photosensitive resin is not limited to a liquid form, and a filmed resin may be laminated on the semiconductor substrate 13. Further, an electric conductive layer 15 may be formed directly on an inorganic insulation coat, such as of silicon nitride, or silicon oxide generally covering and protecting a surface of IC chip. In circuitry of IC chip 3 thus fabricated, there may be given typical circuits for electric conduction, and functions else, such as of an inductor, a capacitor, and a resistor.

[5]

Then, as illustrated in FIG. 5(f), an IC chip fabricated in the process [4] above has a position determined by a mounter for semiconductor chip, to a base material fabricated in the process [3], and is heated at temperatures below a hardening temperature of an electric conductive paste forming the interlayer binding material 9A and plugging electrodes 5A, and provisionally joined thereto.

[6]

Figure 7:
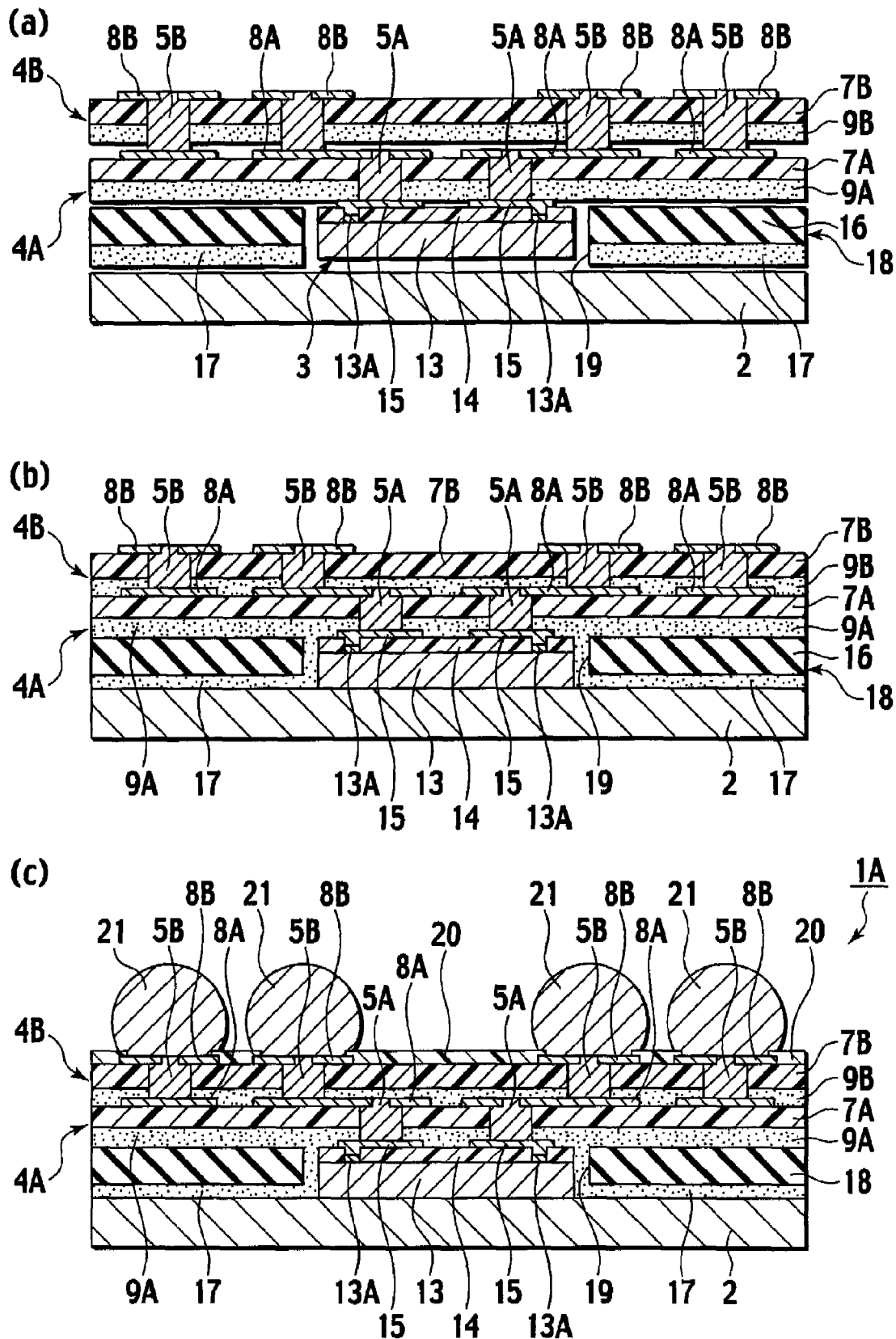
In FIG. 7, (a) to (c) are sections by steps illustrating respective steps (steps in a latter half) of the method of manufacturing the printed wiring board 1A according to the first embodiment of the present invention.

In FIG. 7, (a) to (c) are sections illustrating respective steps (steps in a latter half) of the method of manufacturing the printed wiring board 1A according to the first embodiment of the present invention.

Next, as illustrated in FIG. 7(a), on that side of the wired base material 4A formed in the process [5] where the circuit pattern 8A is formed, a wired base material 4B fabricated by similar processes to the above-mentioned processes [1] to [3] is positioned by using an unshown pattern. The wired base material 4B has an insulating layer 7B, an interlayer binding material 9B, plugging electrodes 5B, and a circuit pattern 8B, like the wired base material 4A formed in the process [5]. It is noted that the circuit pattern 8B and plugging electrodes 5B provided to the wired base material 4B are set to achieve configuration of a desirable re-wiring (as a wiring layer provided to enable the implementation from pads on the IC chip to a board to be implemented), when combined with the wired base material 4A.

Further, on an opposite side to the side of the wired base material 4A where the circuit pattern 8A is formed, within a region avoiding the IC chip 3, there is disposed a spacer 18 having a binding material 17 of a thickness of 25 µm glued on one side of a resin film 16 of a thickness of 40 µm. In addition, at a lower layer side of the IC chip 3, there is disposed a copper foil of a thickness of 100 µm laminated thereon as a supporting board 2 opposing the wired base material 4A, with the IC chip 3 in between.

The spacer 18 has an opening 19 largish than the area of IC chip 3 formed in advance at a portion to lap over the IC chip 3, when laminated. It is noted that for the spacer 18, preferably, the material in use for the resin film 16 should be an identical resin to the insulating layer 7A of wired base material 4A fabricated in the process [1], which may however be a resin else, or a metal or the like. For the binding material 17, preferably, this should be an identical material to the interlayer binding material 9A of wired base material 4A fabricated in the process [2], which may however be a material else. Further, the spacer 18 may be eliminated, if the board of an upper-most layer has wiring intervals not so wide relative to the chip size.

For the supporting board 2, this is not limited to a copper foil, and a metallic sheet else, or a resinous sheet may be used, which preferably should be a substance excellent in property of heat dissipation, and near in coefficient of expansion to silicon that is a main component of the IC chip 3, and there may well be used a metallic sheet having molybdenum or Invar alloy sandwiched from both sides by copper, for example.

[7]

Then, the laminate fabricated in the process [6] above is hot pressed in a pressure-reduced atmosphere of 1 kPa or less, using a vacuum cure press machine, whereby it is multi-layered at once, as illustrated in FIG. 7(b). In this situation, a hardening of the electric conductive paste forming the plugging electrodes 5A, 5B is performed, concurrently with a hardening of the interlayer binding materials 9A, 9B (an adhesive bonding between the insulating base materials, and an adhesive bonding of the insulating base materials and the IC chip 3). As used herein, the term "hardening" refers not simply to a thermal curing (cross-linking reaction), but also a hardening to be caused when a material softened by a heating is cooled.

As illustrated at (a), (b) in FIG. 7, the interlayer binding material 9A or the insulating layer 7A having an adhesion property flows when hot-pressed, filling voids caused between IC chip 3, insulating layer 7A, supporting board 2, and spacer 18. The IC chip 3 is thereby sealed and fixed in the wiring board. Further, due to an adequate elasticity of materials contacting the IC chip 3, such an effect is given that relieves thermal stress or the like acting on the IC chip 3 from surrounding materials.

Here are one-side CCLs formed in advance with circuitry and used as wired base materials 4A, 4B forming part of a re-wiring layer, and plugging electrodes 5A, 5B made of a print-filled electric conductive paste and used for interlayer connections, whereby plating processes can be eliminated from respective processes, allowing for a wide reduction of production time, in comparison with a build-up process in the past. In addition, base materials constituting respective layers are prefabricated, and non-conforming works appearing in respective processes can be rejected from time to time, allowing for an avoidable accumulation of yields. As an electric conductive paste for interlayer connections, that one which has a composition affording an alloying at low temperatures about a hardening temperature of the interlayer binding material may be applied, as described in Japanese Patent Laying-Open Publication No. 2000-49460, for example, whereby metallic particles in the electric conductive paste can be diffusion-bonded in between, as well as between metallic particles of the electric conductive paste and connection pads of copper, allowing for a secured connection reliability equivalent to interlayer connections such as by bulk metal or plating.

[8]

Then, as illustrated in FIG. 7(c), a solder mask layer 20 and solder bumps 21 are formed on a multi-layer board fabricated in the process [7] above. For formation of the solder mask layer 20, a photosensitive resin in liquid form is screen-printed, and after exposure, a pattern is developed. For formation of solder bumps 21, a solder paste is screen-printed, and re-flowed in ball form. The printed wiring board (multi-layer wiring board) 1A of the present embodiment is obtainable by the foregoing processes.

Second Embodiment

Figure 8:
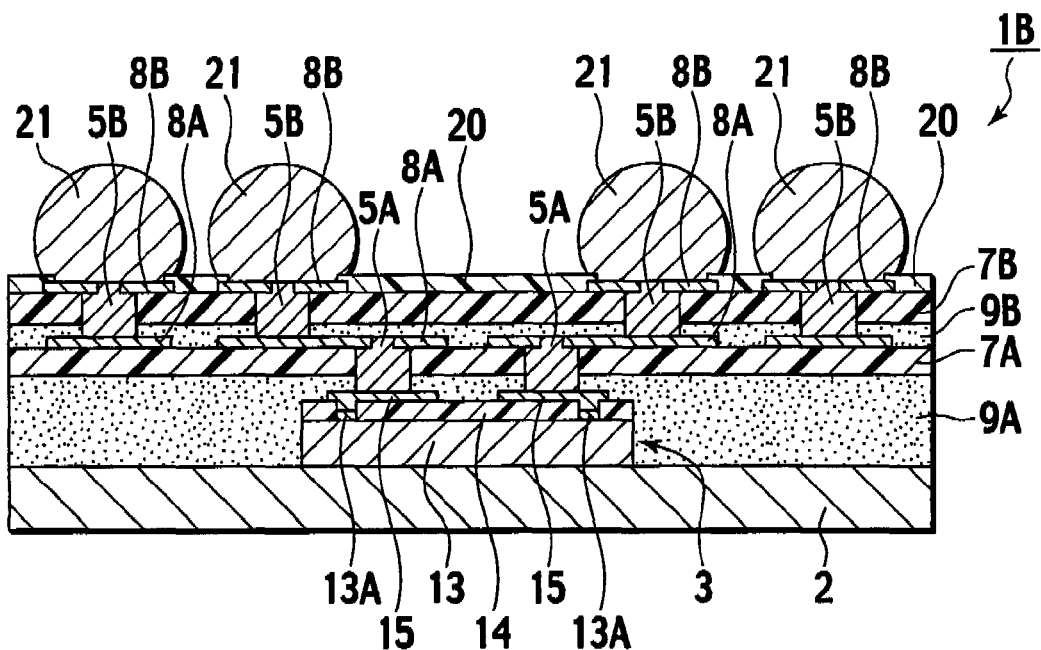
FIG. 8 is a configuration illustrating sectional view of a printed wiring board according to a second embodiment of the present invention.

FIG. 8 is a configuration illustrating sectional view of a printed wiring board 1B according to a second embodiment of the present invention.

It is noted that for this embodiment et seq., like members to the printed wiring board 1A according to the first embodiment will be designated by like symbols, eliminating the description.

As illustrated in FIG. 8, in the printed wiring board 1B according to the present embodiment an interlayer binding material 9A glued on an insulating layer 7A has a thickness for an IC chip 3 to be buried sufficiently, whereby it is allowed to omit the spacer 18 described in the process [5] of the first embodiment.

Third Embodiment

Figure 9:
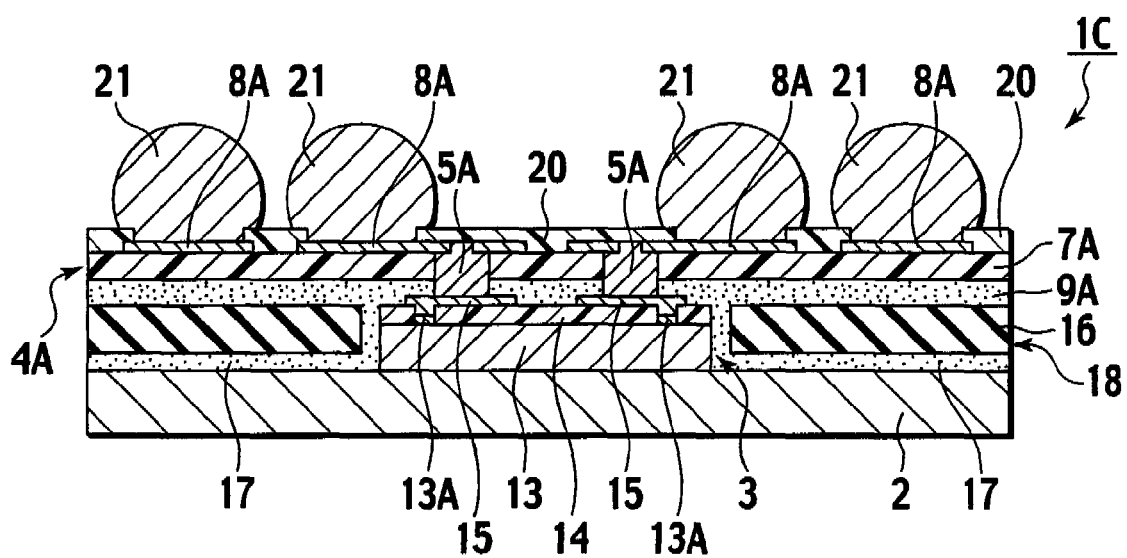
FIG. 9 is a configuration illustrating sectional view of a printed wiring board according to a third embodiment of the present invention.

FIG. 9 is a configuration illustrating sectional view of a printed wiring board 1C according to a third embodiment of the present invention.

According to the present embodiment as illustrated in FIG. 9, the printed wiring board 1C has, above an IC chip 3, a wired base material 4A laminated simply by a single layer to constitute a re-wiring layer. In this embodiment, bumps 21 are formed on a wiring pattern 8A of the wired base material 4A. It is noted that the layer number of wired base material 4A, which is one in this embodiment may be a plurality of 3 or more. It is also noted that a supporting board 2 may be removed after a lump-sum lamination in the process [7] of the first embodiment.

Fourth Embodiment

Figure 10:
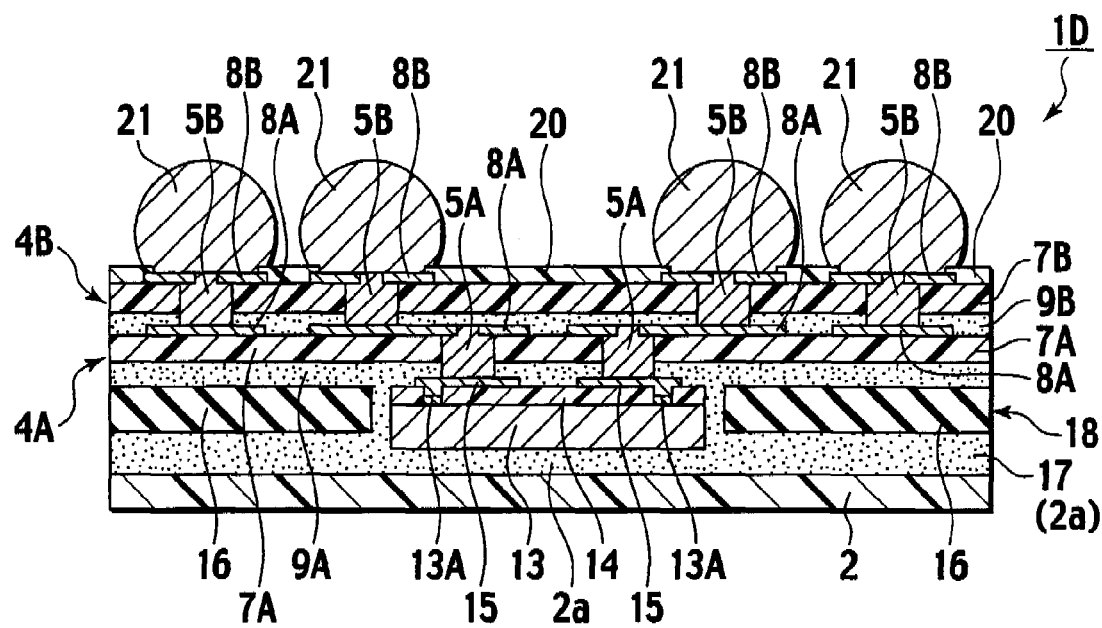
FIG. 10 is a configuration illustrating sectional view of a printed wiring board according to a fourth embodiment of the present invention.

FIG. 10 is a configuration illustrating sectional view of a printed wiring board 1D according to a fourth embodiment of the present invention.

In the printed wiring board 1D according to this embodiment, as illustrated in FIG. 10, an IC chip 3 is formed with an electric conductive layer 15 that constitutes part of a re-wiring portion, and mounted as a semiconductor device on a supporting board 2, with a binding material 2a in between, and has a wired base material 4A individually fabricated in advance and laminated thereon, for a configuration to be multi-layered at once.

Like the first embodiment described, the electric conductive layer 15 formed on the IC chip 3 and a wired base material 4A have their interlayer conduction pads interconnected by plugging electrodes 5A made of an electric conductive paste, constituting a re-wiring layer. Further, the IC chip 3 is buried in an insulating base material (a binding material) included in the wired base material 4A.

In a manufacturing method of the printed wiring board 1D, steps in a former half thereof are identical to the steps in the former half of the first embodiment illustrated in FIG. 5.

Further, in this embodiment, the IC chip 3 is fabricated like the IC chip 3 in the first embodiment illustrated in FIG. 6. As illustrated in FIG. 5(f), this IC chip 3 is positioned by a mounter for semiconductor chip, and is heated at temperatures below a hardening temperature of an electric conductive paste forming the interlayer binding material 9A and plugging electrodes 5A, and provisionally joined thereto.

Figure 11:
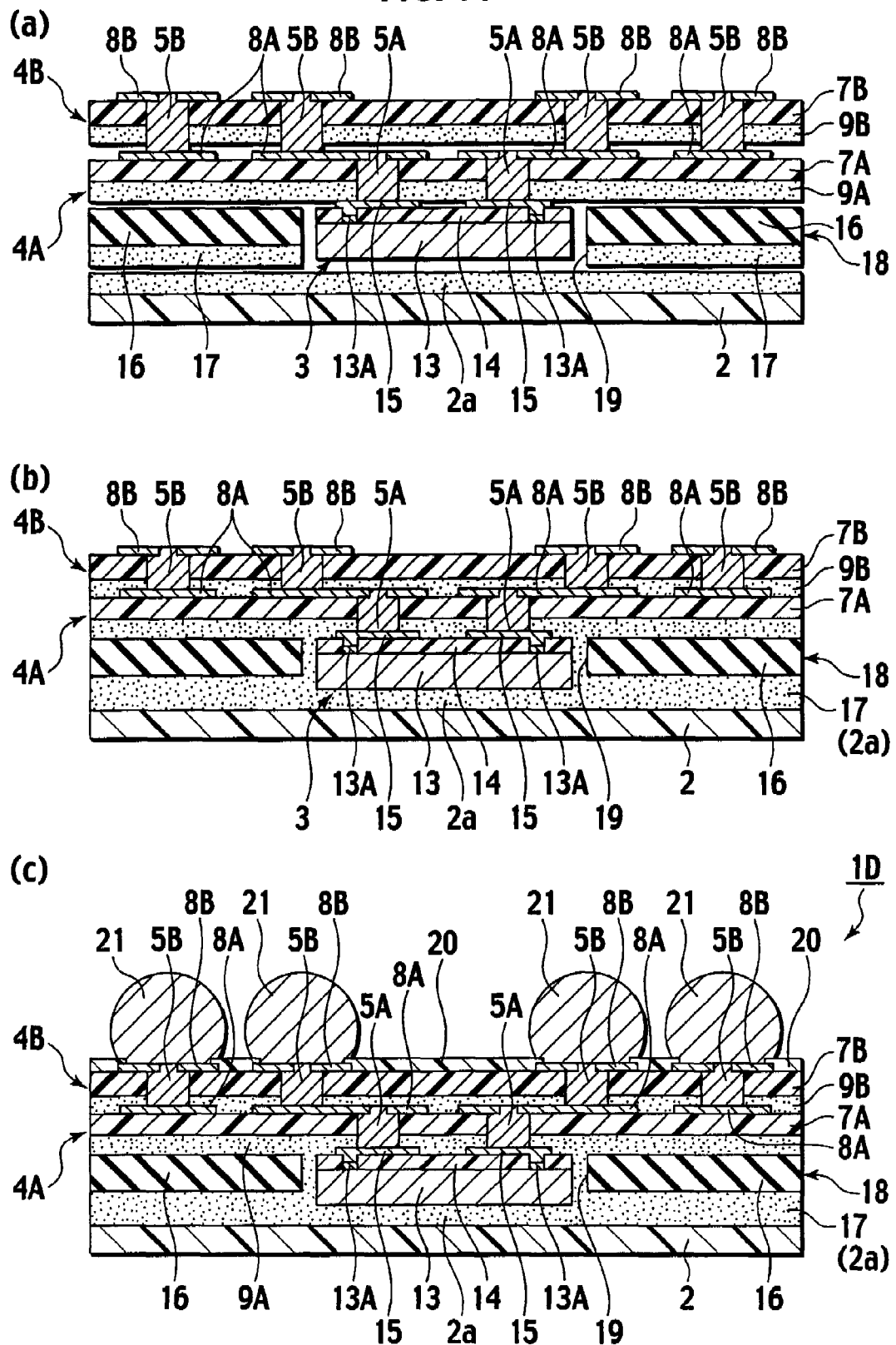
In FIG. 11, (a) to (c) are sections by steps illustrating respective steps (steps in a latter half) of a method of manufacturing the printed wiring board according to the fourth embodiment of the present invention.

In FIG. 11, (a) to (c) are sections illustrating respective steps (steps in a latter half) of the method of manufacturing the printed wiring board 1D according to the fourth embodiment of the present invention.

In this embodiment, as illustrated in FIG. 11(a), on that side of the wired base material 4A after completion of processes of the former half where a circuit pattern 8A is formed, a wired base material 4A fabricated by like processes to the before-mentioned processes is positioned by using an unshown pattern. Further, on an opposite side to the side of the wired base material 4A where the circuit pattern 8A is formed, there is disposed a spacer 18 having a binding material 17 of a thickness of 25 μm glued on one side of a resin film 16 of a thickness of 40 μm. In addition, at a lower layer side of the IC chip 3, there is disposed for lamination thereon a base material having a binding material 2a of a thickness of 25 μm glued on a polyimide film of a thickness of 25 μm, as a supporting board 2 disposed on an opposite side to the electric conductive layer 15 of the IC chip 3, with an adhesion layer in between.

The spacer 18 has an opening 19 slightly larger than the area of IC chip 3 formed in advance at a portion to lap over the IC chip 3, when laminated. It is noted that for the spacer 18, preferably, the material in use for the resin film 16 should be an identical resin to the insulating layer 7A, which may however be a resin else, or a metal or the like. For the binding material 17, preferably, this should be an identical material to the interlayer binding material 9A, which may however be a material else. Further, the spacer 18 may be eliminated, if the wiring on board is not so spread relative to the chip size.

For the supporting board 2, this is not limited to a base material having a binding material 2a of a thickness of 25 μm glued on a polyimide film of a thickness of 25 μm, and a metallic sheet else, or a resinous sheet may be used, which preferably should be a substance excellent in property of heat dissipation, and near in coefficient of expansion to silicon that is a main component of the IC chip 3, and there may well be used a metallic sheet having molybdenum or Invar alloy sandwiched from both sides by copper, for example.

Next the laminate fabricated in the processes hitherto is hot pressed in a pressure-reduced atmosphere of 1 kPa or less, using a vacuum cure press machine, whereby it is multi-layered at once, as illustrated in FIG. 11(b). In this situation, a hardening of the electric conductive paste forming the plugging electrodes 5A, 5B is performed, concurrently with a hardening of the interlayer binding material 9A and the binding material 2a (an adhesive bonding between the insulating layers 7A, 7B, and an adhesive bonding of the insulating layer 7A and the IC chip 3). As used herein, the term "hardening" refers not simply to a thermal curing (cross-linking reaction), but also a hardening to be caused when a material softened by a heating is cooled.

The interlayer binding material 9A and the binding material 2a or the insulating layer 7A having an adhesion property flow or flows when hot-pressed, filling voids caused between IC chip 3, insulating layer 7A, supporting board 2, and spacer 18 ((a), (b) in FIG. 11). The IC chip 3 is thereby sealed and fixed in the wiring board. Further, due to an adequate elasticity of the base material 2a contacting the IC chip 3, such an effect is given that relieves thermal stress or the like acting on the IC chip 3 from surrounding materials.

Here are one-side CCLs formed in advance with circuitry and used as wired base materials 4A, 4B forming part of a re-wiring layer, and plugging electrodes 5A, 5B made of a print-filled electric conductive paste and used for interlayer connections, whereby plating processes can be eliminated from respective processes, allowing for a wide reduction of production time, in comparison with a build-up process in the past In addition, base materials constituting respective layers are prefabricated, and non-conforming works appearing in respective processes can be rejected from time to time, allowing for an avoidable accumulation of yields. As an electric conductive paste for interlayer connections, that one which has a composition affording an alloying at low temperatures about a hardening temperature of the interlayer binding material may be applied, as described in Japanese Patent Laying-Open Publication No. 2000-49460, for example, whereby metallic particles in the electric conductive paste can be diffusion-bonded in between, as well as between metallic particles of the electric conductive paste and connection pads of copper, allowing for a secured connection reliability equivalent to interlayer connections such as by bulk metal or plating.

Then, as illustrated in FIG. 11(c), a solder mask layer 20 and solder bumps 21 are formed on a multi-layer board fabricated in the processes hitherto. For formation of the solder resist layer 20, a photosensitive resin in liquid form is screen-printed, and after exposure, a pattern is developed. For formation of solder bumps 21, a solder paste is screen-printed, and re-flowed in ball form. The printed wiring board (multi-layer wiring board) 1D of the present embodiment is obtainable by the foregoing processes.

Like this, the presence of a binding material between the supporting board 2 and a rear side of the IC chip 3 allows for an enhanced binding force between the IC chip 3 and the supporting board 2. Further, according to the present invention, a multi-layer board is cure-pressed in a later process, resulting in an enhanced flatness of an entire board, in comparison with a structure having no adhesion layer at the rear side, either.

It is noted that preferably, as illustrated at (a) to (c) in FIG. 12, IC chips 3 should be configured with an electric conductive layer 15 formed by a plating on a first insulating layer 14A coated on a surface of a semiconductor board 14, and a circuit portion 15A made of the electric conductive layer 15 covered with a second insulating layer 14AB.

In configuration of an IC chip 3 illustrated in FIG. 12(a), the electric conductive layer 15 has a circuit portion 15A totally covered with the second insulating layer 14B, and a portion thereof constituting a land part covered simply along a periphery by the second insulating layer 14B, leaving the land part substantially exposed. In an IC chip 3 illustrated in FIG. 12(b), a periphery of the electric conductive layer 15 constituting a land part is uncovered, and the connection area of electric conductive layer 15 is set large. Further, in FIG. 12(c), the second insulating layer 14B constitutes an enclosure that allows exposure of a lateral wall part of the electric conductive layer 15 constituting a land part, as well, and an electric conductive paste constituting a plugging electrode 5A is extended to come up to the lateral wall part, allowing for a reduced resistance between the plugging electrode 5A and the electric conductive layer 15, as an advantage.

IC chips of such a structure can prevent exposure of the electric conductive layer 15 after connection to a plugging electrode, thus allowing for a prevented corrosion of electric conductive layer 15. Further, when the plugging electrode 5A of the wired base material 4A and the IC chip 3 are positioned for a provisional joint projections of an electric conductive paste (plugging electrode 5A) may contact a circuit portion 15A passing between land parts of the IC chip 3 due to an issue of positional accuracy of the IC chip 3, as an apprehension, while the contact can be prevented by covering such a circuit portion 15A with the second insulating layer 14B. Such a contact gets remarkable as wiring rules on the IC chip 3 gets finer. Further, projections of electric conductive paste are crushed, more or less spreading in planer directions, in the hot-pressing process to position the IC chip 3, but the contact can be prevented by covering the circuit portion 15A with the second insulating layer 14B. Therefore, by provision of IC chips 3 of such a structure, it becomes unnecessary, even for a short spacing between land part and circuit portion, to make the plugging electrode 5A thin to be kept from reaching the circuit portion 15A, thus allowing for, among others, an increased via diameter, a micro-fabrication of wiring rules on IC chip 3, and a reduced via pitch.

This embodiment provides an IC chip 3 of a structure with a first insulating layer 14A, an electric conductive layer 15, and a second insulating layer 14B, as illustrated at (a) to (c) in FIG. 12, thereby allowing the electric conductive layer 15 to be protected by the second insulating layer 14B, as an effect.

Fifth Embodiment

Figure 13:
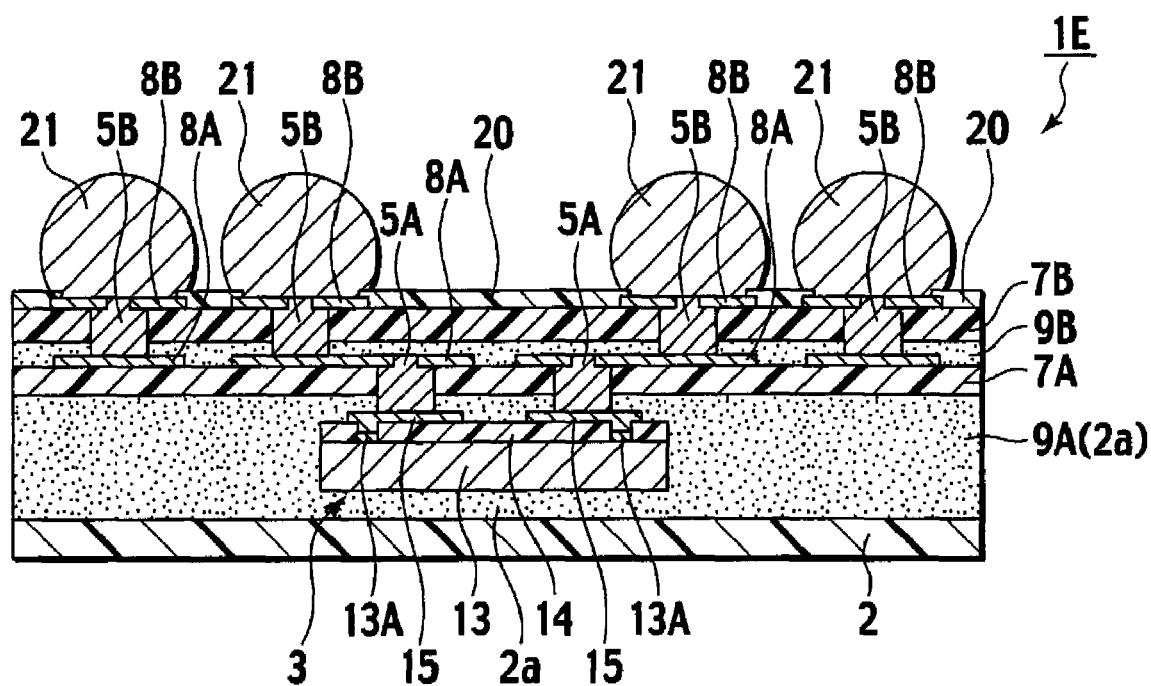
FIG. 13 is a configuration illustrating sectional view of a printed wiring board according to a fifth embodiment of the present invention.

FIG. 13 is a configuration illustrating sectional view of a printed wiring board 1E according to a fifth embodiment of the present invention.

The printed wiring board 1E according to this embodiment is an example of the above-noted fourth embodiment in which the spacer 18 is omitted. In the present embodiment, the interlayer insulating layer 9A glued on the insulating layer 7A has a thickness for an IC chip 3 to be buried sufficiently. In the present embodiment, other configuration is identical to the fourth embodiment and the description is omitted.

Sixth Embodiment

Figure 14:
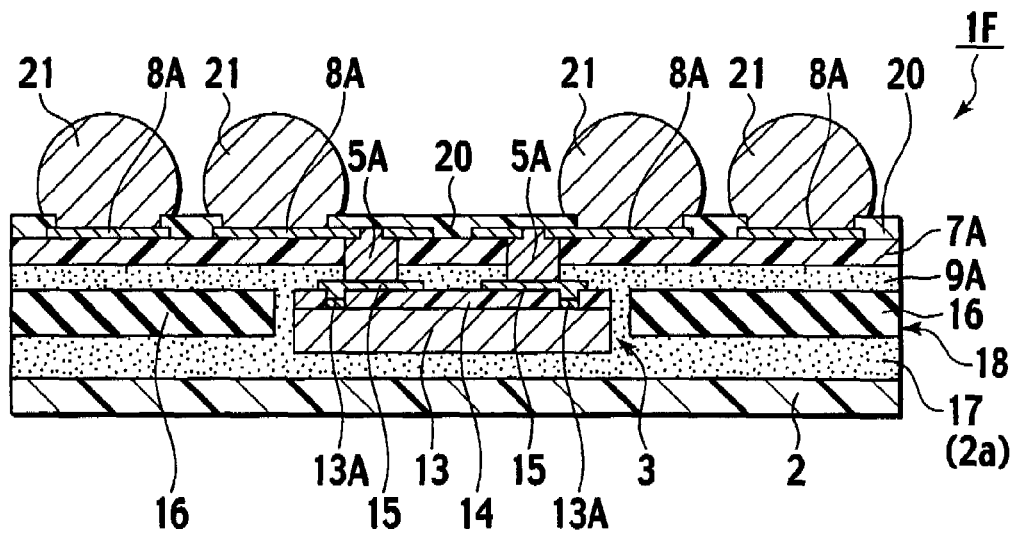
FIG. 14 is a configuration illustrating sectional view of a printed wiring board according to a sixth embodiment of the present invention.

FIG. 14 is a configuration illustrating sectional view of a printed wiring board 1F according to a sixth embodiment of the present invention.

According to the present embodiment the printed wiring board 1F has, in configuration of the fourth embodiment a wired base material 4A laminated above an IC chip 3 simply by a single layer to constitute a re-wiring layer. It is noted that the layer number of wired base material may be a plurality of 3 or more.

Seventh Embodiment

Figure 15:
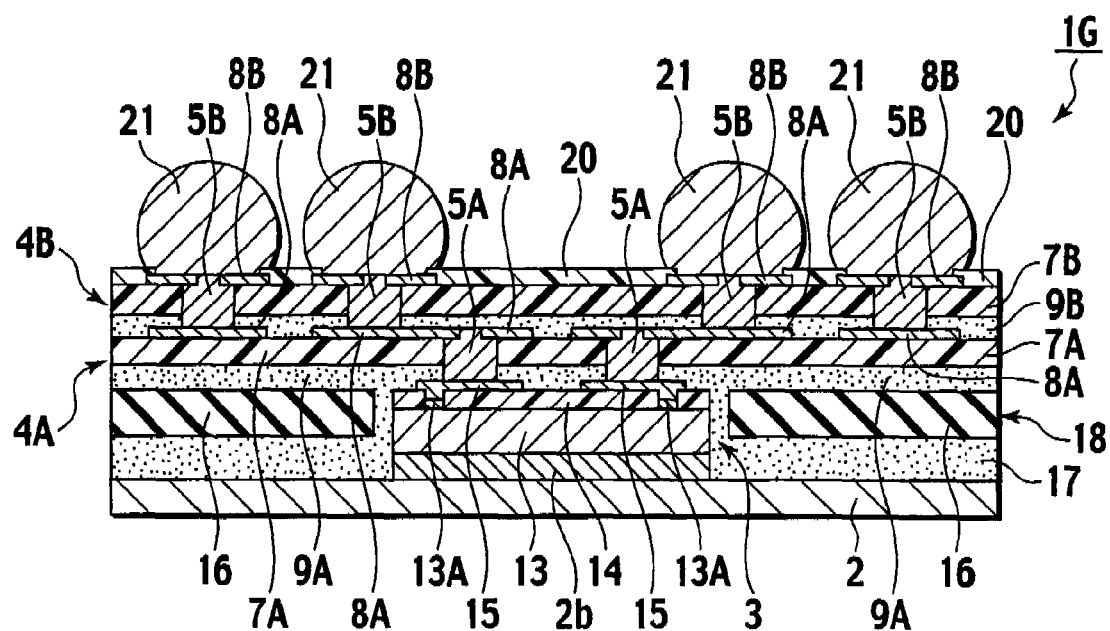
FIG. 15 is a configuration illustrating sectional view of a printed wiring board according to a seventh embodiment of the present invention.

FIG. 15 is a configuration illustrating sectional view of a printed wiring board 1G according to a seventh embodiment of the present invention.

In the printed wiring board (multi-layer wiring board) 1G according to this embodiment, as illustrated in FIG. 15, an IC chip 3 is formed with an electric conductive layer 15 that constitutes a re-wiring portion, and mounted as a semiconductor device on a supporting board 2, with a heat conductive material 2b in between, and has a wired base material 4A individually fabricated in advance and laminated thereon, for a configuration to be multi-layered at once.

Like the first embodiment described, the electric conductive layer 15 formed on the IC chip 3 and wired base materials 4A, 4B have their interlayer conduction pads interconnected by plugging electrodes 5A, 5B made of an electric conductive paste, constituting a re-wiring layer. Further, the IC chip 3 is buried in an insulating base material included in the wired base material 4A.

In a manufacturing method of the printed wiring board 1G, steps in a former half thereof are identical to the steps in the former half of the first embodiment illustrated in FIG. 5, and the description is omitted.

In this embodiment, the IC chip 3 is fabricated like the IC chip in the first embodiment illustrated in FIG. 6. As illustrated in FIG. 5(f), this IC chip 3 is positioned by a mounter for semiconductor chip, and is heated at temperatures below a hardening temperature of an electric conductive paste forming the interlayer binding material 9 and plugging electrodes 5A, and provisionally joined thereto.

In FIG. 16, (a) to (c) are sections illustrating respective steps (steps in a latter half) of the method of manufacturing the printed wiring board 1G according to the seventh embodiment of the present invention.

In this embodiment, as illustrated in FIG. 16(a), on that side of the wired base material 4A after completion of processes of the former half where a circuit pattern 8A is formed, a wired base material 4B fabricated by similar processes to the before-mentioned processes is positioned by using an unshown pattern. Further, on an opposite side to the side of the wired base material 4A where the circuit pattern 8A is formed, there is disposed a spacer 18 having a binding material 17 of a thickness of 25 μm glued on one side of a resin film 16 of a thickness of 40 μm. In addition, at a lower layer side of the IC chip 3, there is disposed for lamination thereon a base material having a binding material 2a of a thickness of 25 μm glued on a copper foil of a thickness of 100 μm, as a supporting board 2 disposed on an opposite side to the electric conductive layer 15 of the IC chip 3, with an adhesion layer in between. It is noted that the spacer 18 has an opening 19 slightly larger than the area of IC chip 3 formed in advance at a portion to lap over the IC chip 3, when laminated. It is noted that for the spacer 18, preferably, the material in use for the resin film 16 should be an identical resin to the insulating layer 7A, which may however be a resin else, or a metal or the like. For the binding material 17, preferably, this should be an identical material to the interlayer binding material 9A, which may however be a material else. Further, the spacer 18 may be eliminated, if the wiring on board is not so expanded relative to the chip size.

In part of the binding material 2a to be glued on the supporting board 2, as illustrated in FIG. 16(a), over an entirety or in part of a region thereof where a downside of the IC chip 3 contacts, there is disposed a heat conductive material 2b. As the heat conductive material 2b, there may be employed a so-called heat conductive binder in which the binding material contains an inorganic filler that has a high heat conductivity. For the present invention, employed is a heat conductive binding material of a heat conductivity of 0.5 W/m·K.

For the supporting board 2, this is not limited to a base material having a binding material 2a of a thickness of 25 μm glued on a copper foil of a thickness of 100 μm, and a metallic sheet else, or a resinous sheet may be used, which preferably should be a substance excellent in property of heat dissipation, and near in coefficient of expansion to silicon that is a main component of the IC chip 3, and there may well be used a metallic sheet having molybdenum or Invar alloy sandwiched from both sides by copper, for example.

In the printed wiring board 1G according to the present embodiment, the heat conductive material 2b resides at least in part between the supporting board 2 and the IC chip 3, whereby heat generated in the IC chip 3 can be efficiently transferred outside the board, thus allowing for application of IC chips of heat high dissipation, such as an IC chip for performing a high speed computation or the like, or an IC chip for handling large currents.

Next, the laminate fabricated in the processes hitherto is hot pressed in a pressure-reduced atmosphere of 1 kPa or less, using a vacuum cure press machine, whereby it is multi-layered at once, as illustrated in FIG. 16(b). In this situation, a hardening of the electric conductive paste forming the plugging electrodes 5A, 5B is performed, concurrently with a hardening of the interlayer binding materials 9A, 9B and the binding material 2a (an adhesive bonding between the insulating layers, and an adhesive bonding of the insulating layer and the IC chip 3). As used herein, the term "hardening" refers not simply to a thermal curing (cross-linking reaction), but also a hardening to be caused when a material softened by a heating is cooled.

The interlayer binding materials 9A, 9B and the binding material 2a or the insulating layer 7A having an adhesion property flow when hot-pressed, filling voids caused between IC chip 3, insulating layer, supporting board 2, and spacer 18 ((a) and (b) in FIG. 16). The IC chip 3 is thereby sealed and fixed in the wiring board. Further, due to an adequate elasticity of the binding material contacting the IC chip 3, such an effect is given that relieves thermal stress or the like acting on the IC chip 3 from surrounding materials.

Here are one-side CCLs formed in advance with circuitry and used as wired base materials 4A, 4B forming part of a re-wiring layer, and plugging electrodes 5A, 5B made of a print-filled electric conductive paste and used for interlayer connections, whereby plating processes can be eliminated from respective processes, allowing for a wide reduction of production time, in comparison with a build-up process in the past In addition, base materials constituting respective layers are prefabricated, and non-conforming works appearing in respective processes can be rejected from time to time, allowing for an avoidable accumulation of yields. As an electric conductive paste for interlayer connections, that one which has a composition affording an alloying at low temperatures about a hardening temperature of the interlayer binding material may be applied, as described in Japanese Patent Laying-Open Publication No. 2000-49460, for example, whereby metallic particles in the electric conductive paste can be diffusion-bonded in between, as well as between metallic particles of the electric conductive paste and connection pads of copper, allowing for a secured connection reliability equivalent to interlayer connections such as by bulk metal or plating.

Then, as illustrated in FIG. 16(c), a solder mask layer 20 and solder bumps 21 are formed on a multi-layer board fabricated in the processes hitherto. For formation of the solder mask layer 20, a photosensitive resin in liquid form is screen-printed, and after exposure, a pattern is developed. For formation of solder bumps 21, a solder paste is screen-printed, and re-flowed in ball form. The printed wiring board (multi-layer wiring board) 1G of the present embodiment is obtainable by the foregoing processes.

Eighth Embodiment

Figure 17:
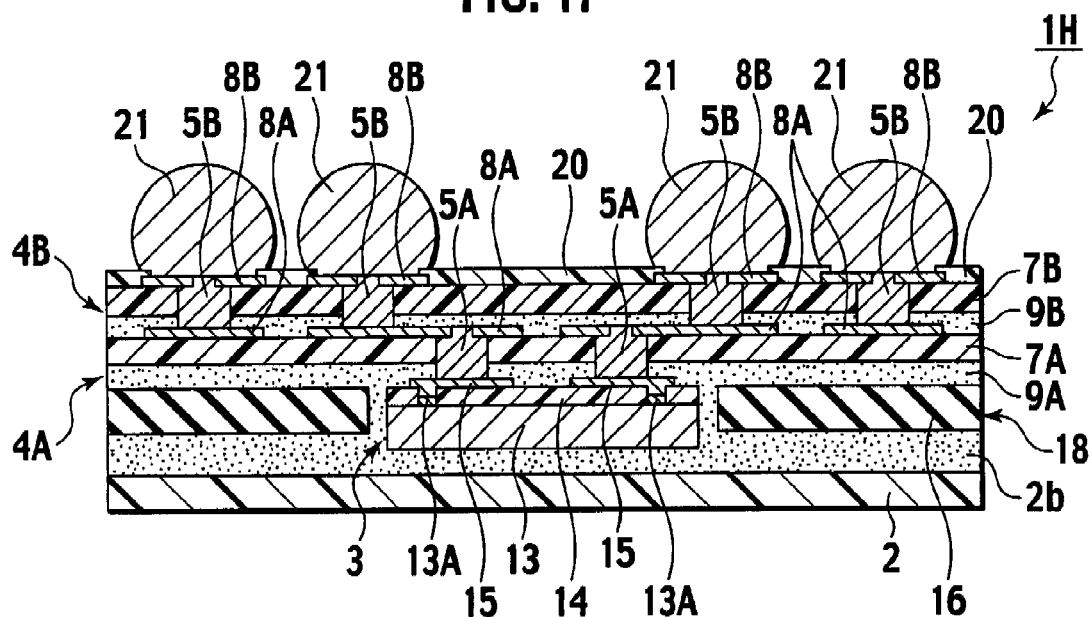
FIG. 17 is a configuration illustrating sectional view of a printed wiring board according to an eighth embodiment of the present invention.

FIG. 17 is a configuration illustrating sectional view of a printed wiring board 1H according to an eighth embodiment of the present invention.

For the printed wiring board 1H according to this embodiment, it is unnecessary to have a heat conductive material 2b residing simply between an IC chip 3 and a supporting board 2, and whole interlayer binding materials may be composed of a heat conductive binding material comprising a heat conductive material 2b, as illustrated in FIG. 17.

Ninth Embodiment

Figure 18:
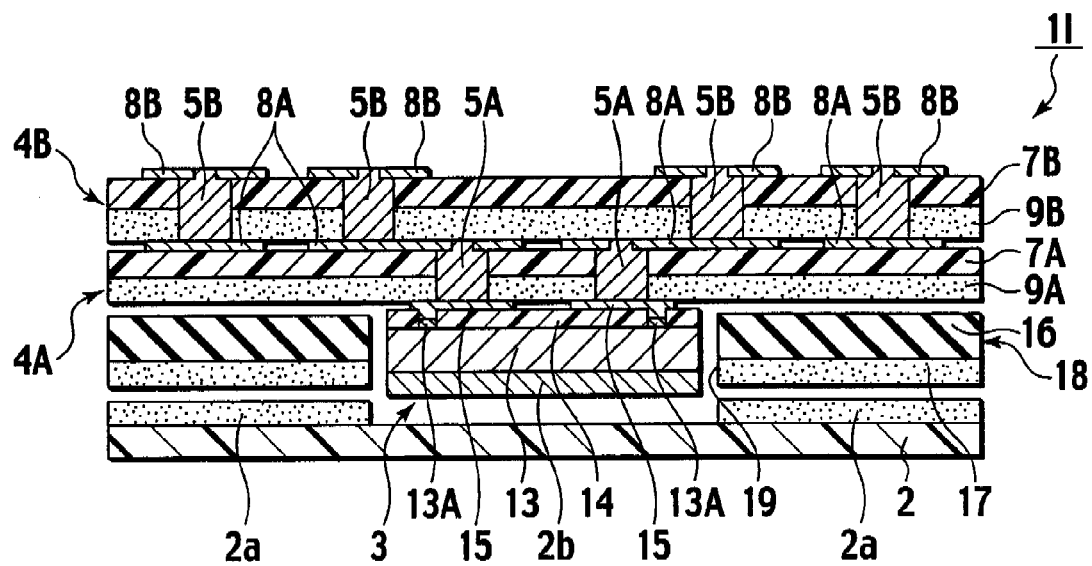
FIG. 18 is a configuration illustrating sectional view of a printed wiring board according to a ninth embodiment of the present invention.

FIG. 18 is a configuration illustrating sectional view of a printed wiring board 1I according to a ninth embodiment of the present invention.

For this embodiment, the heat conductive material 2b is not needed to be glued on a supporting board 2 in the way of manufacturing process, and it may be glued on a downside of an IC chip 3, as illustrated in FIG. 15.

It is noted that in this case, as a manufacturing method of the IC chip 3, the heat conductive material 2b may be glued on a rear side of a wafer before the dicing illustrated in FIG. 6(a), and by a dicing thereafter, such an IC chip 3 may be obtained with ease that has a heat conductive material 2b glued on an opposite side to the circuit.

Tenth Embodiment

Figure 19:
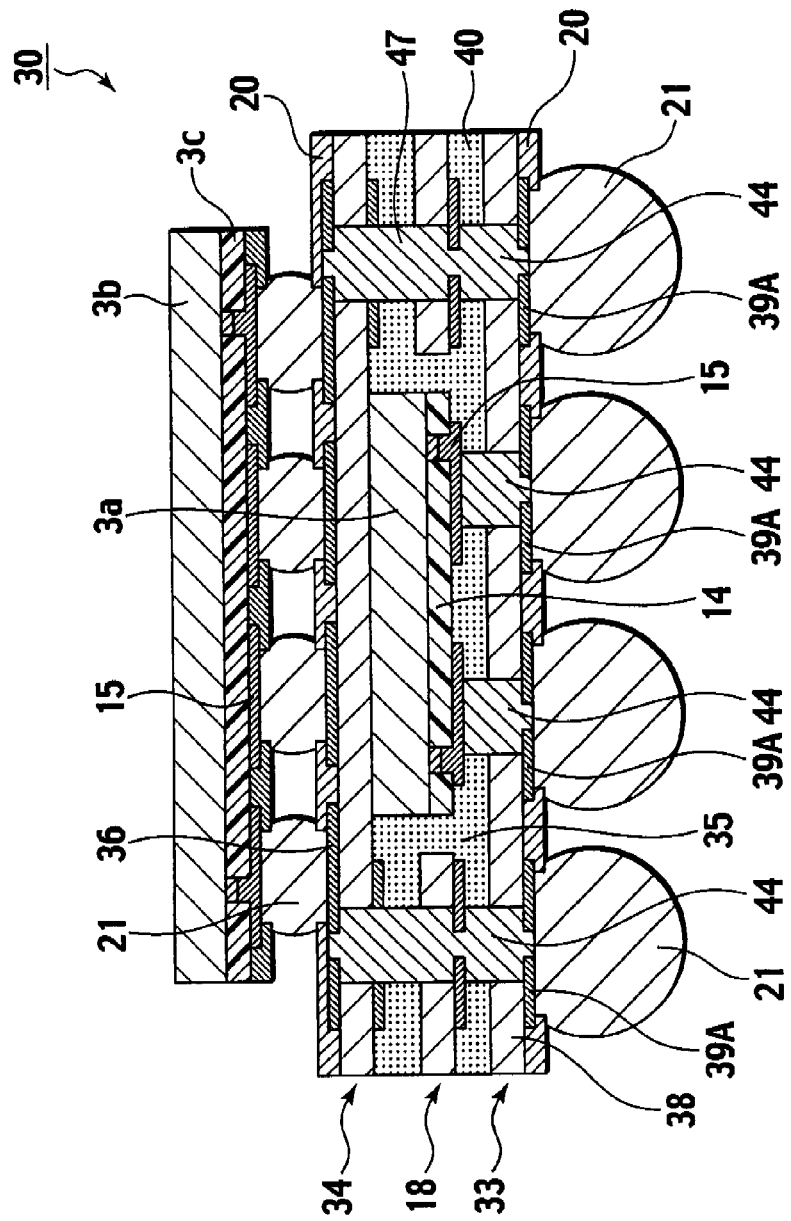
FIG. 19 is a configuration illustrating sectional view of a printed wiring board according to a tenth embodiment of the present invention.

FIG. 19 is a configuration illustrating sectional view of a printed wiring board 30 according to a tenth embodiment of the present invention.

In the printed wiring board (multi-layer wiring board) 30 according to this embodiment, as illustrated in FIG. 19, an IC chip 3a as a semiconductor device is formed with an electric conductive layer 15 that constitutes part of a re-wiring layer, and mounted on a first wired base material 33 individually fabricated in advance, and the IC chip 3a is interposed between the first wired base material 33 and a second wired base material 34 individually fabricated in advance, for a configuration to be multi-layered at once.

The electric conductive layer 15 formed on the IC chip 3a and the first wired base material 33 are interconnected by first plugging electrodes 44 having their pads for interlayer conduction made of an electric conductive paste, constituting a re-wiring layer. Further, the IC chip 3a is buried in an interlayer binding material 35 of the first wired base material 33.

Further, the second wired base material 34 is connected, via plugging electrodes or the like, to the IC chip 3a, and another IC chip (semiconductor device) 3b is connectable on the second wired base material 34, via pad portions 36.

Figure 20:
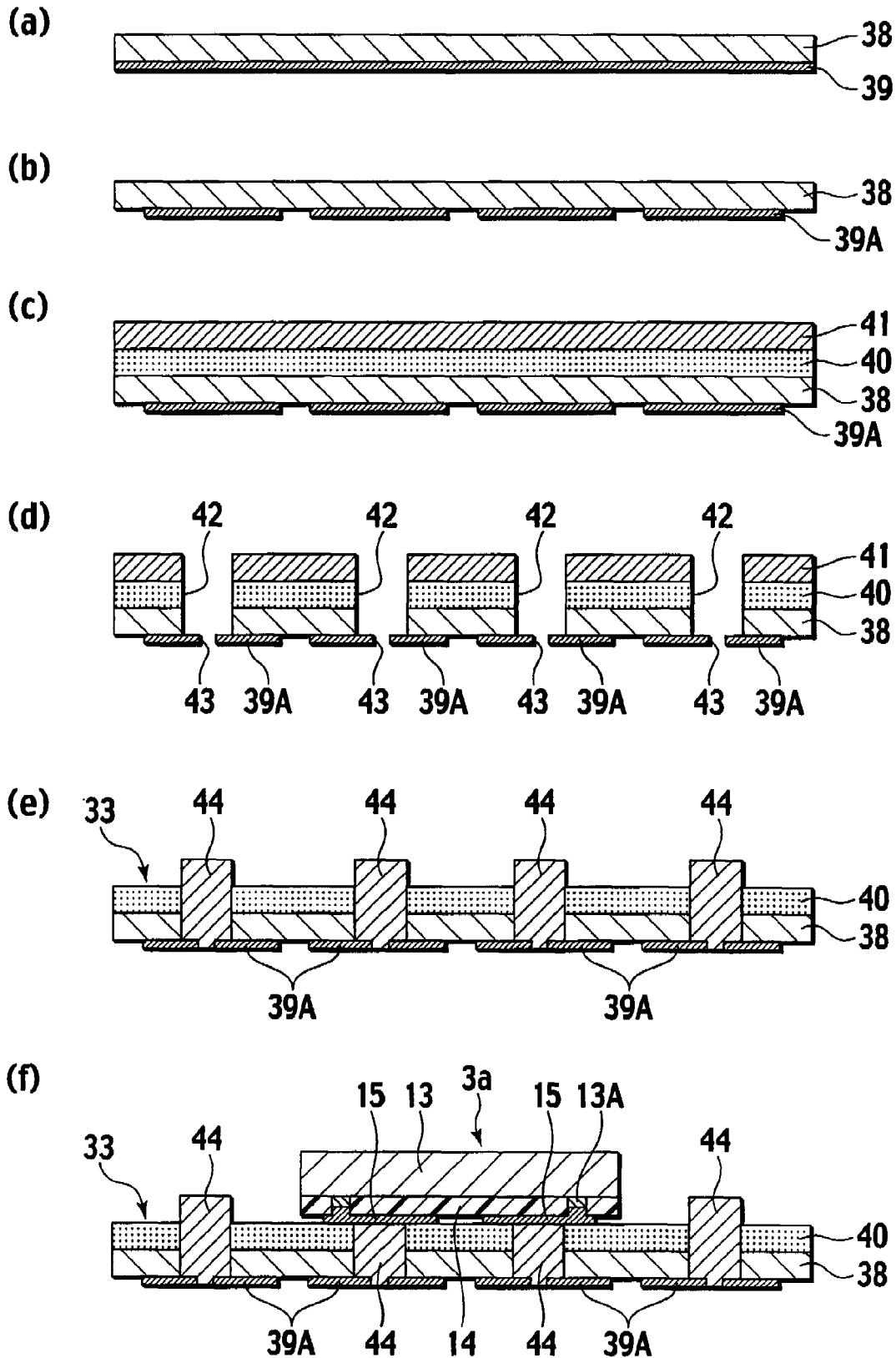
In FIG. 20, (a) to (f) are sections by steps illustrating respective steps (steps in a former half) of a method of manufacturing the printed wiring board according to the tenth embodiment of the present invention.

Given in FIG. 20 are sections illustrating respective steps (steps in a former half) of a method of manufacturing the printed wiring board 30 according to the present embodiment.

Description is now made of a manufacturing method of the printed wiring board, using FIG. 20.

[1A]

First, the first wired base material 33 is fabricated. Namely, As illustrated in FIG. 20(a), on a CCL in which a copper foil 39 that will make an electric conductive layer is provided on one side of an insulating layer 38 made of a polyimide resin film, there is given a photolithography, thereby forming an unshown etching resist, and thereafter, using an etchant consisting primarily of ferric chloride, a chemical etching is made, thereby forming a circuit pattern 39A, as illustrated in FIG. 20(b).

As the CCL, in use is such one that has a copper foil 39 of a thickness of 12 μm glued on an insulating layer 38 composed of a polyimide resin film of a thickness of 25 μm. It is noted that as a CCL to be used, there may be such one as fabricated by a so-called casting method, in which a polyimide varnish is applied to a copper foil 8, and the varnish is hardened. And besides, as the CCL to be used, there may be, among others, a CCL in which on a polyimide resin film a seed layer is sputtered, and copper is grown by a plating, or a CCL in which a rolled or electrolytic copper film and a polyimide resin film are glued together by an adhesive agent.

Further, the insulating layer 38 in use may not necessarily be a polyimide resin film, and may be a plastic film such as a liquid crystal polymer. Further, the etchant in use may not necessarily primly consist of ferric chloride, and may be an etchant consisting primarily of cupric chloride.

[2A]

As illustrated in FIG. 20(c), of the CCL after the process [1A] above, an opposite side to the circuit pattern has an interlayer binding material 40 and a resin film 41 glued thereon by a hot pressing. The interlayer binding material 40 in use is an epoxy type thermo-set film binding material of a thickness of 25 μm, and the resin film 41 in use is a polyimide film of a thickness of 25 μm. For the hot pressing, in use is a vacuum laminator, whereby they are pressed for a gluing in a pressure-reduced atmosphere, at a temperature below a hardening temperature of the interlayer binding material 40, under a pressure of 0.3 MPa The insulating layer 38 and the interlayer binding material 40 will constitute an insulating base material having an adhesion property. It is noted that, as an insulating layer 38 to be used, if this be such one that is made of a resin having a thermal plasticity or a thermo-set resin in a partially set state and has an adhesion property, then it is unnecessary to have the interlayer binding material 40 glued together.

The interlayer binding material 40 in use here is not limited to an epoxy type thermo-set film binding material, and such a binding material as an acrylic type may be used, or it may be such a thermo-plastic binding material as represented by a thermo-plastic polyimide or the like. Further, the interlayer binding material 40 in use may not necessarily have a film form and may be a varnish-like resin to be applied. Further, the resin film 41 in use may be a plastic film other than polyimide, such as a PET polyethylene terephthalate) or a PEN polyethylene naphthalate), or may be such a film as capable of adhesion as well as exfoliation by UV (ultraviolet ray) irradiation.

[3A]

Next, as illustrated in FIG. 20(d), via holes 42 of a diameter of 100 μm are formed by a YAG laser through the above-noted insulating layer 38, interlayer binding material 40, and resin film 41, and small holes 43 of diameters about 30 μm are opened in the circuit pattern 39A. Then, after a plasma desmear treatment by a $CF_4$ and $O_2$ mixed gas, as illustrated in FIG. 20(e), by a screen printing method, the via holes 42 and the small holes 43 are filled with an electric conductive paste to make first plugging electrodes 44, and the resin film 41 is exfoliated. In this situation, the first plugging electrodes 44 made of the print-filled electric conductive paste have their distal ends protruded from a surface of the interlayer binding material 40, as much as the thickness of the exfoliated resin film 41, thus forming protrusions.

It is noted that the laser in use for formation of via holes 42 and small holes 43 may be a YAG laser or else, such as a carbon dioxide gas laser or an excimer laser. Further, via holes 42 and small holes 43 may be formed by a drill machining or chemical etching. For the plasma desmear treatment, the gas in use is not limited to a $CF_4$ and $O_2$ mixed gas, and as a gas else, an inactive gas such as Ar may be used. Further, instead of the dry treatment, there may be a wet desmear treatment using a chemical solution. The electric conductive paste in use to make the first plugging electrodes 44 is a paste containing in this embodiment at least one kind of metallic particles of low electric resistance and selective from among nickel, silver, and copper, and at least one kind of metallic particles of low melting point and selective from among tin, bismuth, indium, and lead, and having epoxy-based binder components mixed thereto.

[4A]

The IC chip 3a is fabricated in an identical method to FIG. 6 illustrating the first embodiment.

[5A]

Then, as illustrated in FIG. 20(f), an IC chip 3a fabricated in the process [4A] above has a position determined by a mounter for semiconductor chip, to the first wired base material 33 fabricated in the process [3A], and is heated at temperatures below a hardening temperature of an electric conductive paste forming the interlayer binding material 40 and the first plugging electrodes 44, and provisionally joined thereto.

[6A]

Figure 21:
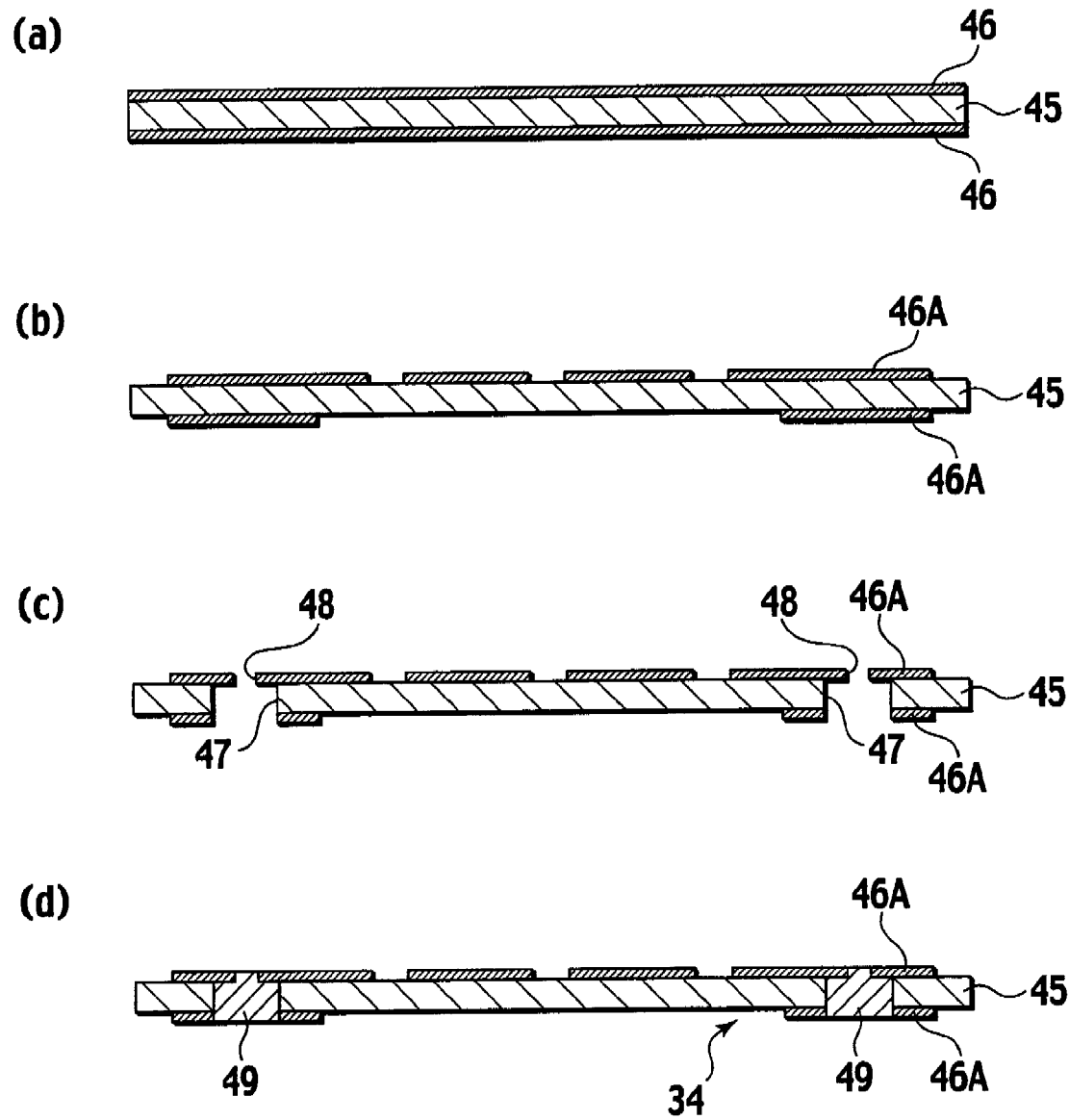
In FIG. 21, (a) to (d) are sections by steps illustrating an example of fabrication of a second wired base material in the tenth embodiment of the present invention.

Given in FIG. 21 are sections illustrating an example of fabrication of the second wired base material 34.

First, as illustrated in FIG. 21(a), on a two-side CCL in which copper foils 46 that will make electric conductive layers are provided on both sides of an insulating layer 45 made of a polyimide resin film, like the process [1A] there is given a photolithography, thereby forming unshown etching resists, and thereafter, using an etchant consisting primarily of ferric chloride, a chemical etching is made, thereby forming circuit patterns 46A, as illustrated in FIG. 21(b).

As the CCL, in use here is such one that has copper foils 46 of a thickness of 12 μm glued on both sides of an insulating layer 45 composed of a polyimide resin film of a thickness of 25 μm. As the CCL to be used, there may be such one as fabricated by a so-called casting method. And besides, there may be used, among others, a CCL in which on a polyimide resin film seed layers are sputtered, and copper is grown by a plating, or a CCL in which rolled or electrolytic copper films and a polyimide resin film are glued together by an adhesive agent. Further, the insulating layer 45 in use may be a plastic film such as a liquid crystal polymer. Further, the etchant in use for copper may not necessarily primarily consist of ferric chloride, and may be an etchant consisting primarily of cupric chloride.

As illustrated in FIG. 21(c), via holes 47 of a diameter of 100 μm are formed by a YAG laser through the insulating layer 45 and a circuit pattern 46A on one side, and small holes 48 of diameters about 30 μm are opened in a circuit pattern 46A on the other side. Then, after a plasma desmear treatment by a $CF_4$ and $O_2$ mixed gas, as illustrated in FIG. 21(d), by a screen printing method, the via holes 47 and the small holes 48 are filled with an electric conductive paste to make second plugging electrodes 49.

It is noted that the laser in use for formation of via holes 47 and small holes 48 may be a carbon dioxide gas laser, an excimer laser, or the like. Further, via holes 47 and small holes 48 may be formed by a drill machining or chemical etching. For the plasma desmear treatment an inactive gas such as Ar or else may be used. Further, there may be a wet desmear treatment.

The electric conductive paste in use to make the second plugging electrodes 49 is a paste containing, like the first plugging electrodes 44, at least one kind of metallic particles of low electric resistance and selective from among nickel, silver, and copper, and at least one kind of metallic particles of low melting point and selective from among tin, bismuth, indium, and lead, and having epoxy-based binder components mixed thereto.

[7A]

Given in FIG. 7 are sections illustrating respective steps (steps in a latter half) of the method of manufacturing the printed wiring board 30 according to the present embodiment.

Next, as illustrated in FIG. 22(a), on that side of the first wired base material 33 formed in the process [5A] where the IC chip 3a is provisionally joined (the opposite side to the side where the circuit pattern 39A is provided), a third wired base material 53 having an interlayer binding material 52 of a thickness of 25 μm glued on one side of a resin film 51 of a thickness of 40 μm is disposed after a positioning using an unshown pattern. The third wired base material 53 is fabricated by similar processes to the before-mentioned processes [1A] to [3A]. The third wired base material 53 has an opening 54 slightly larger than the area of the IC chip 3a formed in advance at a portion to lap over the IC chip 3a, when laminated. In this situation, an upside of the IC chip 3a and a surface of the interlayer binding material 52 of the third wired base material 53 are positioned substantially on a flat plane. Further, in this embodiment the third wired base material 53 has third plugging electrodes 56 located in positions overlapping the first and second plugging electrodes 44, 49. For such the structure that have overlapping plugging electrodes 44, 56, 49, the printed wiring board 30 is allowed to be enhanced in strength as well as rigidity.

It is noted that for the third wired base material 53, preferably, the material in use for the resin film 51 should be an identical resin to the insulating layer 38 of the wired base material fabricated in the process [1A], which may however be a resin else, or a metal or the like. For the interlayer binding material 52, preferably, this should be an identical material to the interlayer binding material 40 of the base material fabricated in the process [2A], which may however be a material else. Further, the third wired base material 53 may be unnecessary, if the board has a wiring not so much spread relative to the chip size. Further, the third wired base material 53, which is configured as a wired base material with a copper foil 55 to constitute an electric conductive layer, may be provided as a simple base material without provision of the copper foil 55.

And, the wired base material 34 is laminated on the upper layer side of the IC chip 3a, after a positioning by an unshown pattern.

[8A]

Then, the laminate fabricated in the process [7A] above is hot pressed in a pressure-reduced atmosphere of 1 kPa or less, using a vacuum cure press machine, whereby it is multi-layered at once, as illustrated in FIG. 22(b). In this situation, a hardening of the electric conductive paste forming the first plugging electrodes 44 and a hardening of the electric conductive paste forming the second plugging electrodes 47 are performed, concurrently with a hardening of the interlayer binding material 40 (an adhesive bonding between the insulating base materials, and an adhesive bonding of the insulating base materials and the IC chip 3a). As used herein, the term "hardening" refers not simply to a thermal curing (cross-linking reaction), but also a hardening to be caused when a material softened by a heating is cooled.

The interlayer binding material 40 or the insulating layer 38 having an adhesion property flows when hot-pressed, filling voids caused between the IC chip 3a and the insulating base material or the third wired base material 53. The IC chip 3a is thereby sealed and fixed in the wiring board. Further, due to an adequate elasticity of binding materials contacting the IC chip 3a, such an effect is given that relieves thermal stress or the like acting on the IC chip 3a from surrounding materials.

Here are one-side CCL formed in advance with circuitry and used as the first wired base material 33 forming part of a re-wiring layer, and the plugging electrodes 44 made of a print-fled electric conductive paste and used for interlayer connections, whereby plating processes can be eliminated from respective processes, allowing for a wide reduction of production time, in comparison with a build-up process in the past. In addition, base materials constituting respective layers are prefabricated, and non-conforming works appearing in respective processes can be rejected from time to time, allowing for an avoidable accumulation of yields. As an electric conductive paste for interlayer connections, that one which has a composition affording an alloying at low temperatures about a hardening temperature of the interlayer binding material may be applied, as described in Japanese Patent Laying-Open Publication No. 2000-49460, for example, whereby metallic particles in the electric conductive paste can be diffusion-bonded in between, as well as between metallic particles of the electric conductive paste and connection pads of copper, allowing for a secured connection reliability equivalent to interlayer connections such as by bulk metal or plating.

[9A]

Figure 22:
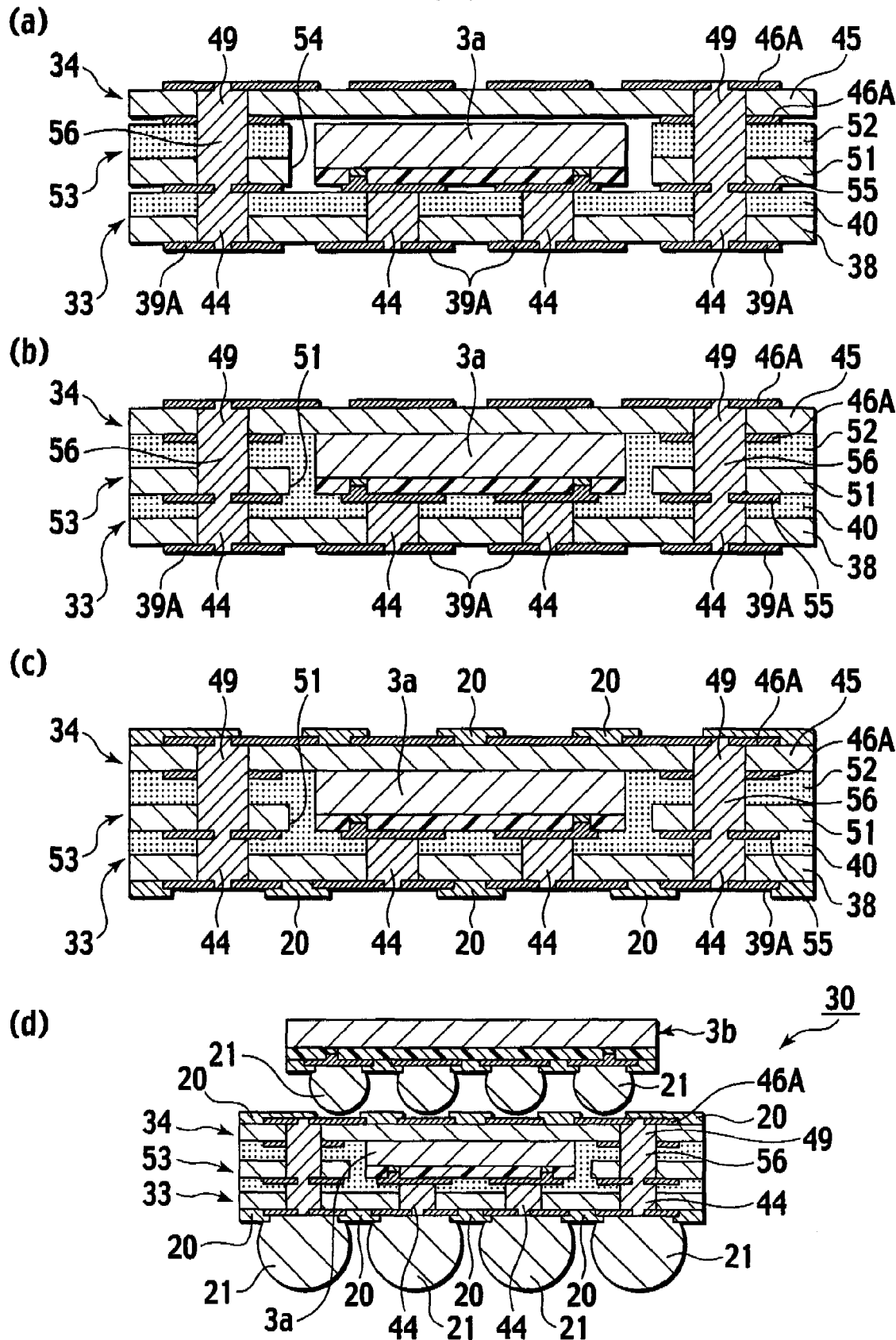
In FIG. 22, (a) to (d) are sections by steps illustrating respective steps (steps in a latter half) of the method of manufacturing the printed wiring board according to the tenth embodiment of the present invention.

Then, as illustrated at (c) and (d) in FIG. 22, solder mask layers 20 and solder bumps 21 are formed on a multi-layer board fabricated in the process [8A] above. For formation of the solder resist layers 20, a photosensitive resin in liquid form is screen-printed, and after exposure, patterns are developed. For formation of solder bumps 21, a solder paste is screen-printed, and re-flowed in ball form. The printed wiring board (multi-layer wiring board) 30 of the present embodiment is obtainable by the foregoing processes.

[10A]

Further, as illustrated in FIG. 22(d), on one side of the printed wiring board (multi-layer wiring board) 30 configured as described, there may be implemented an IC chip 3b formed with a re-wiring layer or the like.

By use of configuration according to the present embodiment, wirings from chips implemented on a multi-layer wiring board are pulled down substantially vertically, which allows IC chips to be laminated three-dimensional, without providing a large package area for wiring pull-down, in comparison with multi-layer wiring boards in the past. Further, the layers are interconnected by electric conductive paste vias included in a re-wiring layer, which allows for a thinner package in comparison with a multi-layer wiring board in the past in which laminated packages are interconnected by solder bumps.

Eleventh Embodiment

Figure 23:
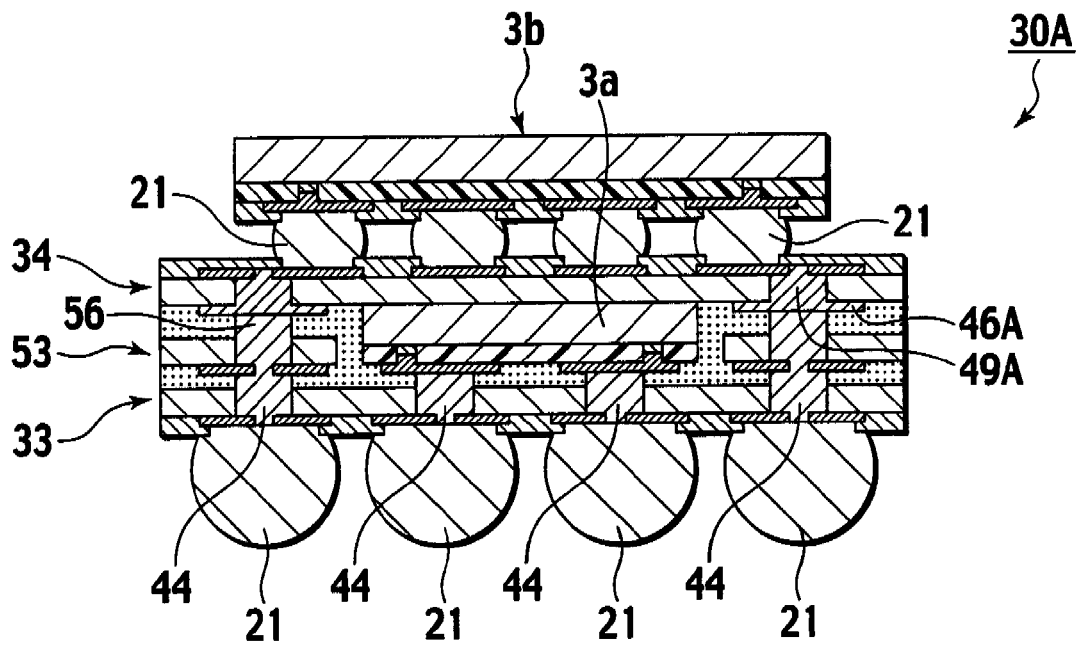
FIG. 23 is a configuration illustrating sectional view of a printed wiring board according to an eleventh embodiment of the present invention.

FIG. 23 is a configuration illustrating sectional view of a printed wiring board 30A according to an eleventh embodiment of the present invention. It is noted that this embodiment has a second wired base material 34 different from the above-noted tenth embodiment.

In other words, in the printed wiring board 30A according to the present embodiment, the second wired base material 34 employs filled vias having via holes filled with plating vias 49A, as illustrated in FIG. 23. In the tenth embodiment, between a wiring portion (circuit pattern 46A) of the second wired base material 34 and a wiring portion (circuit pattern 46A) of the second plugging electrodes 49, the electrical connection is performed simply by contact with areas determined from diameters of the second plugging electrodes 49 and a circuit thickness of wiring portion (circuit pattern 46A). However, in the present embodiment, plating vias 49A are integrated with second plugging electrodes 49 and a circuit pattern 46A, thus allowing for an yet increased reliability in electrical connection of the entire board.

Twelfth Embodiment

Figure 24:
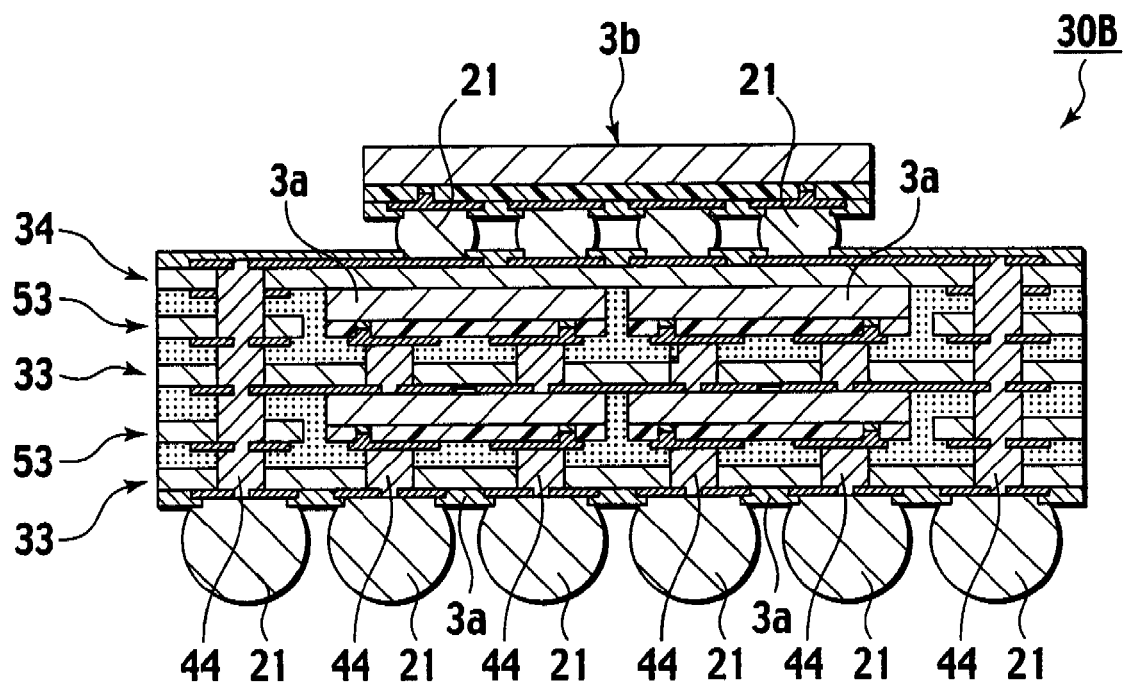
FIG. 24 is a configuration illustrating sectional view of a printed wiring board according to a twelfth embodiment of the present invention.

FIG. 24 is a configuration illustrating sectional view of a printed wiring board 30B according to a twelfth embodiment of the present invention.

In the printed wiring board 30B according to the present embodiment, as illustrated in FIG. 24, first wired base materials 33 and IC chips 3a are laminated, encompassing a plurality of stages. The printed wiring board 30B is configured with a plurality of IC chips 3a disposed on a plane (on the same first wired base material 33).

In this embodiment, a plurality of IC chips 3a can be sealed in the printed wiring board 30B, with an enhanced density of implementation.

Thirteenth Embodiment

Figure 26:
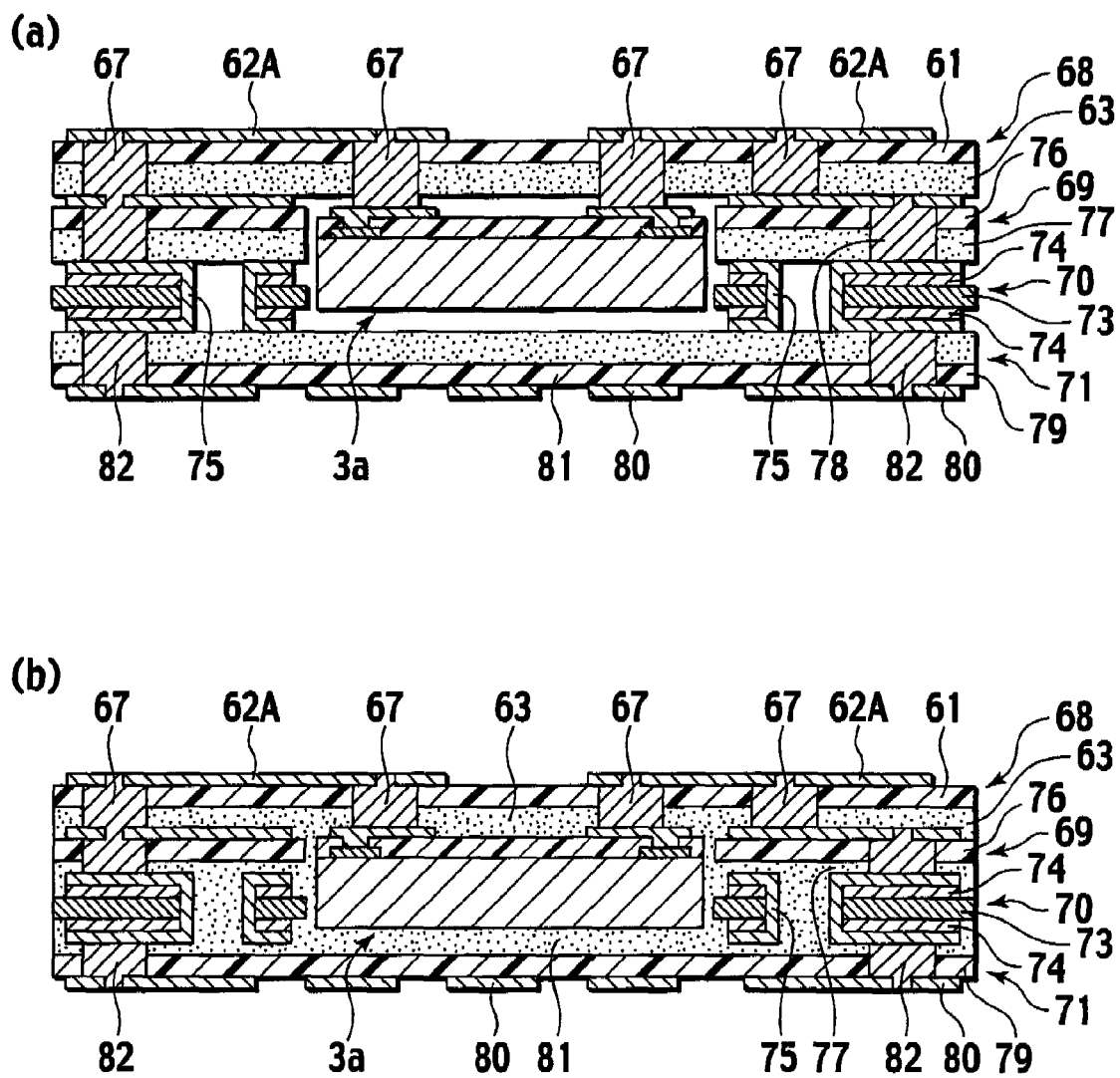
In FIG. 26, (a) and (b) are sections by steps illustrating the method of manufacturing the printed wiring board according to the thirteenth embodiment of the present invention.
Figure 27:
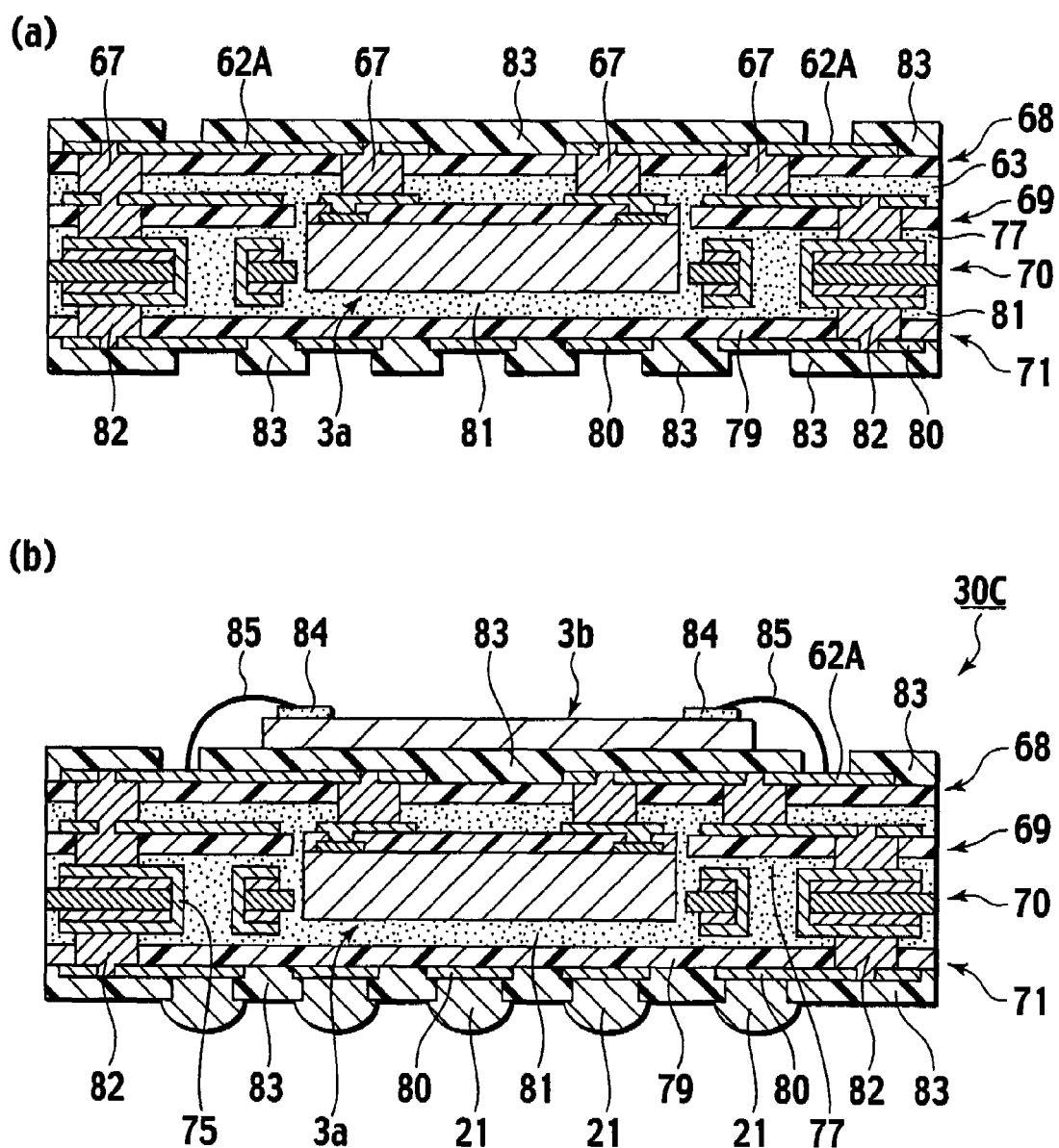
In FIG. 27, (a) and (b) are sections by steps illustrating the method of manufacturing the printed wiring board according to the thirteenth embodiment of the present invention.

Description is now made of a printed wiring board 30C according to a thirteenth embodiment of the present invention. FIGS. 25 to 27 illustrate a method of manufacturing the printed wiring board 30C.

First, as illustrated in FIG. 25(a), there is provided a CCL having a copper foil 61 of a thickness of e.g. 12 μm glued on one side of an insulating layer 38 composed of e.g. a polyimide resin film. It is noted that, for the present embodiment, although in use in is a CCL in which the copper foil 62 is glued on the insulating layer 61, it may be such one as fabricated by a so-called casting method, in which a polyimide varnish is applied to a copper foil 62, and the varnish is hardened. And besides, as the CCL to be used, there may be, among others, a CCL in which on a polyimide resin film a seed layer is sputtered, and copper is grown by a plating, or a CCL in which a rolled or electrolytic copper film and a polyimide resin film are glued together by an adhesive agent. Further, the insulating layer 61 in use may be a plastic film such as a liquid crystal polymer. Further, the etchant in use may not necessarily primarily consist of ferric chloride, and may be an etchant consisting primarily of cupric chloride.

Next, on the copper foil 62, using a photolithography, an unshown etching resist is patterned, and thereafter, using an etchant consisting primarily of e.g. ferric chloride, a wet etching is made, forming a circuit pattern 62A. Thereafter, as illustrated in FIG. 25(b), the etching resist is removed.

Next, as illustrated in FIG. 25(c), for the insulating layer 61, the opposite side to the circuit pattern 62A has an interlayer binding material 63 and a resin film 64 glued thereon by a hot pressing. The interlayer binding material 63 in use is an epoxy type thermo-set film binding material of a thickness of 25 μm. The resin film 10 in use is a polyimide film of a thickness of 25 μm. For the hot pressing, in use is a vacuum laminator, whereby they are pressed for a gluing in a pressure-reduced atmosphere, at a temperature below a hardening temperature of the interlayer binding material 62, under a pressure of 0.3 MPa. It is noted that the interlayer binding material 63 in use is not limited to an epoxy type thermo-set film binding material, and such a binding material as an acrylic type may be used, or it may be such a thermo-plastic binding material as represented by a thermo-plastic polyimide or the like. Further, the interlayer binding material 63 in use may not necessarily have a film form, and may be a varnish-like resin to be applied. The resin film 64 in use may be a plastic film other than polyimide, such as a PET or a PEN, or may be such a film as capable of adhesion as well as exfoliation by UV irradiation.

Next, as illustrated in FIG. 25(d), via holes 65 of a diameter of 100 μm are formed by a YAG laser through the circuit pattern 62A, interlayer binding material 63, and resin film 64, and small holes 66 of diameters about 30 μm are opened in the circuit pattern 62A. Then, after a plasma desmear treatment by a $CF_4$ and $O_2$ mixed gas, as illustrated in FIG. 25(e), by a screen printing method, the via holes 65 and the small holes 66 are filled with an electric conductive paste to make plugging electrodes 67, and thereafter the resin film 64 is exfoliated. In this situation, plugging electrodes 67 made of the print-filled electric conductive paste have their distal ends protruded from a surface of interlayer binding material 63, as much as the thickness of exfoliated resin film 10, thus forming protrusions. Like this, the first wired base material 68 is fabricated.

Next, as illustrated in FIG. 25(f), to the first wired base material 68, the IC chip 3a is positioned by a semiconductor chip mounter, and by a heating below hardening temperatures of the binding material and electric conductive paste, provisionally joined thereto.

Next as illustrated in FIG. 26(a), on the interlayer binding material 63 side of the first wired base material 68, a second wired base material 69, a two-side wired base material 70, and a third wired base material 71 are sequentially positioned by use of unshown patterns, and provisionally joined by heating.

It is noted that the second wired base material 69 is formed with an opening 72 given a clearance of 50 μm from an outline of the IC chip 3. The second wired base material 69 is formed with a circuit pattern on one side of the insulating layer 76, and provided with an interlayer binding material 77 on the other side, and has plugging electrodes 78.

The two-side wired base material 70 is formed with circuit patterns 74 on both sides of the insulating layer 73 made of polyimide, and has penetrating holes formed in a portion where the circuit patterns 74 overlap each other, with the insulating layer 73 in between, and a plating applied over the walls of penetrating holes and the two circuit patterns, and formed with through holes. It is noted that for the two-side wired base material 70, employable is any type of two-side wired base material, encompassing, among others, a so-called laser via type that has a plating for conduction to the rear side of a hole-less copper foil, or such one that achieves conduction by an electric conductive paste, not by a plating. Further, the number of wired base materials fabricated in an analogous manner to the first wired base material may depend on the thickness of IC chip 3a to increase or decrease.

Further, there is a third wired base material 71, which can also be fabricated in an analogous manner to the first wired base material 68, and has a circuit pattern 80 formed on one side of an insulating layer 79, an interlayer binding material 81 installed on the other side, and plugging electrodes 82.

Next, such a laminate as illustrated in FIG. 26(a) is hot pressed in a pressure-reduced atmosphere of 1 kPa or less, using a vacuum cure press machine, whereby it is multi-layered at once.

In this situation, a hardening of the electric conductive paste forming the plugging electrodes 67, 75, and 82 is performed, concurrently with a hardening of the interlayer binding materials 63, 77, and 81 (an adhesive bonding between the insulating base materials, and an adhesive bonding of the insulating base materials and the IC chip 3a).

As illustrated in FIG. 26(b), the interlayer binding materials flow when hot-pressed, filling voids caused between IC chip 3a and surrounding members. Through holes 75 have interlayer binding material filled therein. The IC chip 3 is thereby sealed and fixed in the wiring board. Further, due to an adequate elasticity of materials contacting the IC chip 3a, such an effect is given that relieves thermal stress or the like acting on the IC chip 3 from surrounding materials.

Next, as illustrated in FIG. 27(b), solder mask layers 83 are formed, so circuit patterns 62A, 80 on the outer sides of the first wired base material 68 and the third wired base material 71 are exposed in part, as desired. For the formation of solder resist layers 83, a photosensitive resin in liquid form is screen-printed, and after exposure, the patterns are developed.

Then, as illustrated in FIG. 27(b), an IC chip 3b is mounted on the solder mask layer 83 formed on the outer side of the first wired base material 68, and pad portions 84 of the IC chip 3b and the circuit pattern 62A are connected by bonding wires 85. Further, solder bumps 21 are formed in positions where the circuit pattern 80 on the outer side of the third wired base material 71 is exposed through the solder mask layer 83. For the formation of solder bumps 21, a solder paste is pattern-printed, and re-flown in a ball form. Solder bumps 21 may be disposed over an entire region of a bottom side of the third wired base material. Like this, manufacture of the printed wiring board 30C according to the present embodiment is completed.

As illustrated in FIG. 27(b), the printed wiring board 30C according to the present embodiment has a configuration in which the IC chip 3a is enclosed by interlayer binding materials, and the circuit patterns 62A, 80 are provided on the outer sides of the first wired base material 68 and the third wired base material 71 being outer-most layers.

The printed wiring board 30C, which has an IC chip 3a sealed inside, is allowed to have electronic components implemented on the outside, as well. Further, according to the present embodiment the printed wiring board 30C solves the problem of an interlayer exfoliation that otherwise might have occurred in a test under a heating environment where air in voids expands.

Fourteenth Embodiment

Figure 28:
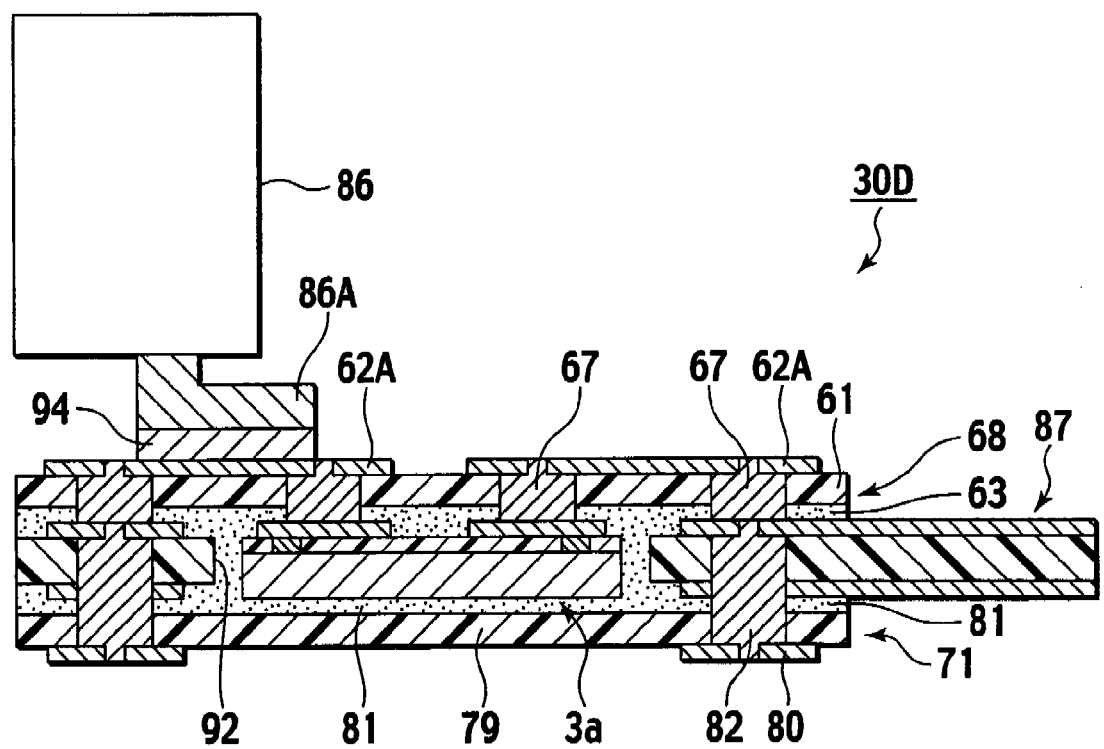
FIG. 28 is a configuration illustrating sectional view of a printed wiring board according to a fourteenth embodiment of the present invention.

FIG. 28 is a configuration illustrating sectional view of a printed wiring board 30D according to a fourteenth embodiment of the present invention.

For the printed wiring board 30D, an IC chip 3a is formed with part of a re-wiring layer, whereon a first wired base material 68, a cable wiring board 87 having flexibility, and a second wired base material 71 are laminated, for a configuration to be multi-layered at once, enabling the fabrication. Further, the first wired base material 68 of the printed wiring board 30D has a connector 86 connected and fixed thereon. The connector 86 has a terminal portion 86A composed of a lead frame soft-soldered with a solder 94 to a circuit pattern 62A of the first wired base material 68. In addition, the IC chip 3a is configured with an interlayer binding material substantially covering an entire surface. Further, the printed wiring board 30D has an intermediate layer, where an end portion of the cable wiring board 87 is provided in a joining manner. The IC chip 3a is disposed in an opening 92 formed in the cable wiring board 87.

Figure 29:
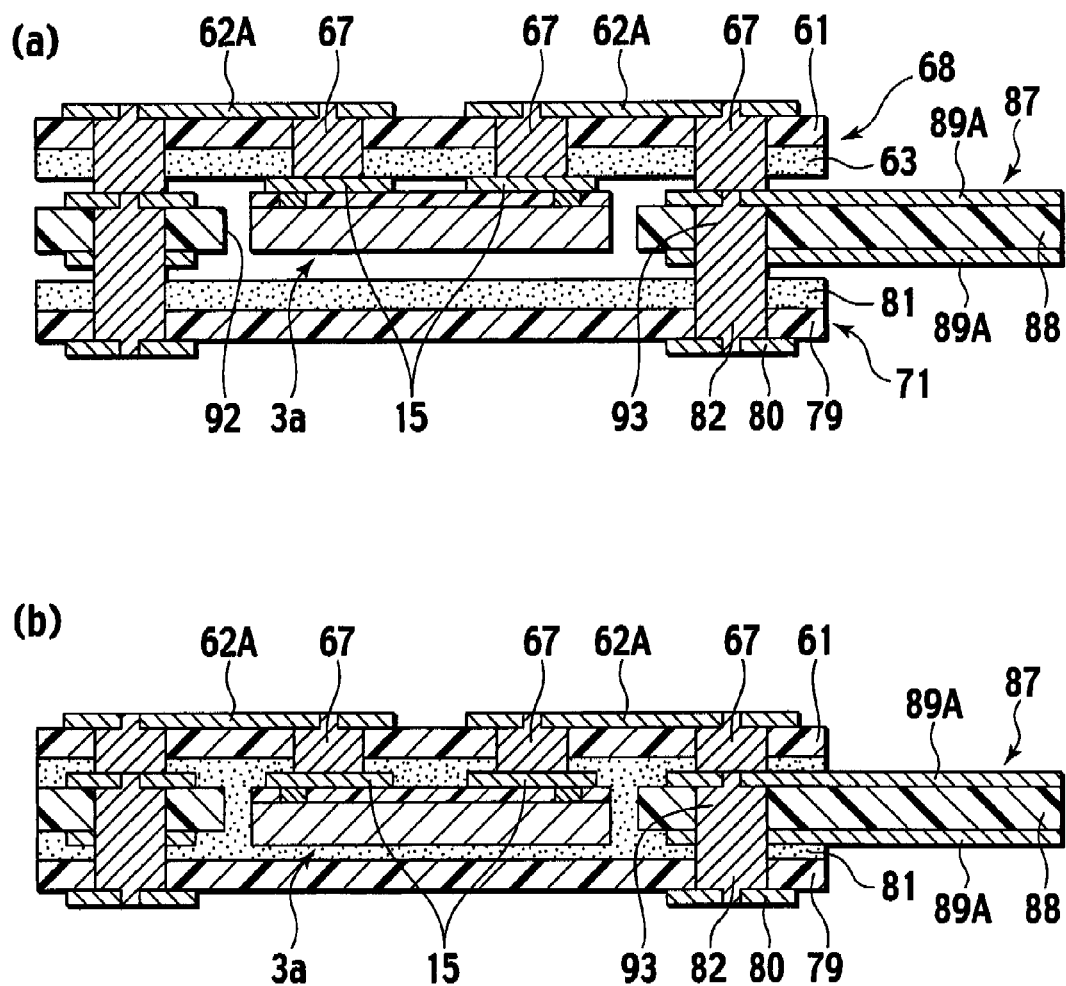
In FIG. 29, (a) and (b) are sections by steps illustrating a method of manufacturing the printed wiring board according to the fourteenth embodiment of the present invention.

Description is now made of a method of manufacturing the printed wiring board 30D, using FIG. 29.

For fabrication of the first wired base material 68, the method is identical to that of the first wired base material 68 in the thirteenth embodiment, and the description is omitted. As illustrated in FIG. 29(a), to the first wired base material 68, the IC chip 3a is positioned by a semiconductor chip mounter, and at once the second wired base material 71 is positioned to the first wired base material 68, and by a heating below hardening temperatures of binding material and electric conductive paste, they are provisionally joined.

It is noted that the cable wiring board 87 has functions of spacer and cable, and can be fabricated through steps illustrated at (a) to (d) in FIG. 30.

First, as illustrated in FIG. 30(a), a CCL is provided, which has copper foils 89 on both sides of an insulating layer 87 made of a polyimide resin film, for example. Next, on the copper foil 89, using a photolithography technique, an unshown etching resist is patterned, and thereafter, using an etchant consisting primarily of e.g. ferric chloride, a wet etching is made, forming circuit patterns 89A, and the etching resist is removed (see FIG. 30(b)). As illustrated in FIG. 30(c), using YAG laser, via holes 90 of a diameter of e.g. 100 μm are opened at specified locations of the insulating layer 87, and small holes 91, in a circuit pattern 89 formed on one side of the insulating layer 87. Thereafter, an opening 54 slightly larger than the area of the IC chip 3a is formed. Next, a plasma desmear treatment is applied, and thereafter, as illustrated in FIG. 30(d), via holes 90 are filled with an electric conductive paste to form plugging electrodes 93.

A laminate illustrated in FIG. 29(a) is hot pressed in a pressure-reduced atmosphere of 1 kPa or less, using a vacuum cure press machine. In this situation, a hardening of the electric conductive paste forming the plugging electrodes 67, 82 is performed, concurrently with a hardening of the interlayer binding materials 63, 81 (an adhesive bonding between the insulating base materials, and an adhesive bonding of the insulating base materials and the IC chip 3a).

As illustrated in FIG. 29(b), the interlayer binding material flows when hot-pressed, filling voids caused in the opening 92 of the cable wiring board 87 and between the IC chip 3a and surrounding members. The IC chip 3a is thereby sealed and fixed in the wiring board. Further, due to an adequate elasticity of the interlayer binding material contacting the IC chip 3a, such an effect is given that relieves thermal stress or the like acting on the IC chip 3a from surrounding materials.

It is noted that the printed wiring board 30D according to the present embodiment has a structure (referred to as "partial multi-layer wiring board") in which the cable wiring board 87 having flexibility is partially multi-layered. As a partial multi-layer wiring board in the past there is such one that so-called glass epoxy boards having e.g. glass fibers impregnated with an epoxy resin are laminated in part of a cable wiring board having flexibility, and through holes are formed for interlayer conduction to be effected by plating. Such a wiring board has a flexible portion and a rigid portion, and is sometimes referred to as a rigid-flex board (R-F board).

Such a rigid-flex board has a partial multi-layer section for implementation of a surface mounting components (referred hereinafter to "SMT"), such as a connector for connection of a separate cable mounting board or a IC for signal filtering, and needs, among others, formation of a plated through hole, or a secured certain area to implement SMT components such as connector or IC. Therefore, down-sizing or area reduction of the wiring board has a limitation, with a resultant bar to miniaturization of electronics in general. In the printed wiring board 30D according to the present embodiment such an IC chip that would have been implemented on a surface of a multi-layered section in the past is buried in the board, and for the interlayer conduction, an electric conductive paste via that can be buried at an arbitrary location of an internal layer of the wiring board is employed, affording a highly dense implementation of the multi-layer portion, in comparison with a rigid-flex board in the past. As a resultant effect, it thus allows for a partial multi-layer wiring section with a reduced area.

Figure 31:
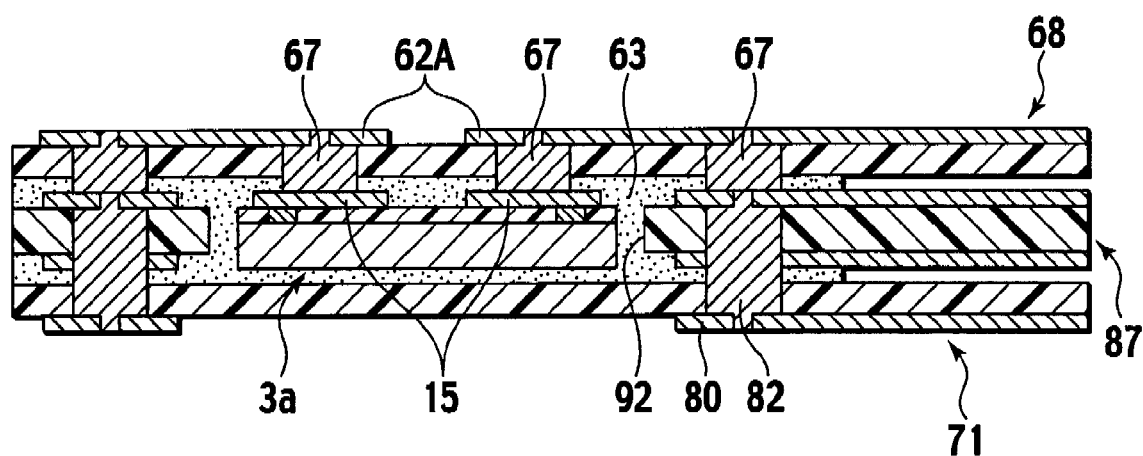
FIG. 31 is a sectional view illustrating a modification of the printed wiring board of the fourteenth embodiment of the present invention.

FIG. 31 illustrates a modification of the present embodiment where this may have a configuration made of soft materials having flexibility at any layer constituting the printed wiring board 30D, in a region in which the bonding by an interlayer binding material is not performed.

As will be seen from the foregoing description, according to the present invention, elimination of a plating process is possible in all manufacturing processes, allowing for a wide reduced production time in comparison with a package substrate in the past. In addition, base materials constituting respective layers are prefabricated, and non-conforming works appearing in respective processes from time to time can be rejected, allowing for an avoidable accumulation of yields.

Further, according to the present invention, as an electric conductive paste for interlayer connections, such one that has a composition affording an alloying at low temperatures about a hardening temperature of the interlayer binding material can be applied, whereby metallic particles in the electric conductive paste can be diffusion-bonded in between, as well as between metallic particles of the electric conductive paste and connection pads of copper, allowing for a secured connection reliability equivalent to interlayer connections such as by bulk metal or plating.

In addition, according to the present invention, by provision of a supporting board, it is allowed to suppress flowage of adhesion layer or insulating base material, allowing for a reduced warpage.

Namely, the present invention can provide a multi-layer printed wiring board having highly defined components implemented, allowing for fabrication by facile processes, without causing, among others, increased costs or decreased yields, and further can provide a method of manufacturing such a printed wiring board.

Other Embodiments

Although embodiments of the present invention have been described, discussions as well as drawings constituting part of disclosure of the embodiments described should not be construed restrictive the invention. For those skilled in the art, various substitute embodiments, examples, and operation techniques will become apparent from the disclosure.

In configurations of embodiments described, as illustrated at (a) to (f) in FIG. 5, a CCL is processed to form via holes 11 and small holes 12, which are filled with an electric conductive paste to form protrusions composed of plugging electrodes 5A, and the protrusions are connected to an electric conductive layer 15 of an IC chip 3. In this respect as illustrated in FIG. 32 and FIG. 33, in a configuration to be taken, a via land may have an electric conductive paste put thereon, and the electric conductive paste may serve for conduction between the electric conductive layer 15 of IC chip 3 and a circuit pattern 8B (with via land inclusive) of a wired base material 4B.

Figure 32:
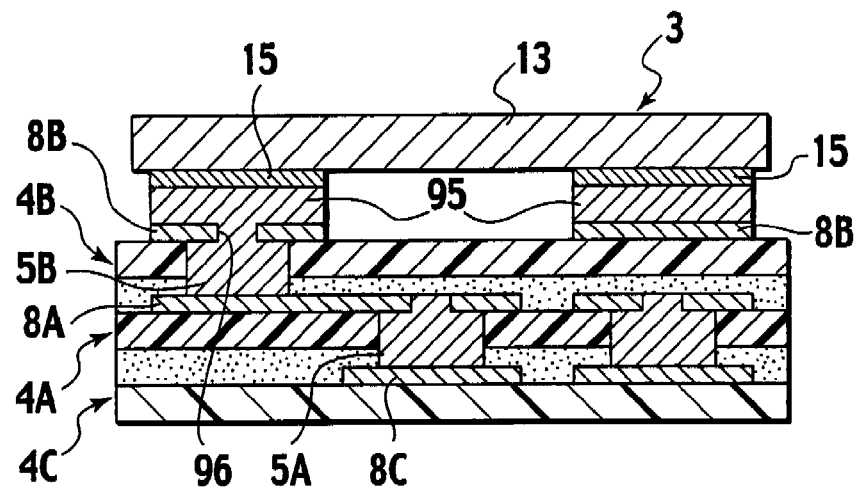
FIG. 32 is a configuration illustrating sectional view of a printed wiring board according to another embodiment of the present invention.

FIG. 32 illustrates a printed wiring board, where wired base materials 4C, 4A, and 4B are laminated, and a circuit pattern (via land) 8B, which has a small hole 96 fronting a via hole provided with a plugging electrode 5B, and an IC chip on the circuit pattern 8D are connected, with an electric conductive paste 95 in between. Here, electric conductive paste in the via hole and electric conductive paste 95 on the circuit pattern 8B are mixed or integrated together without interfacial surfaces at the small hole 96 on the circuit pattern 8B, when hardened. For electric conductive pastes containing a resin as a binder, electric conductive paste in the via hole and electric conductive paste 95 on the circuit pattern 8B become mixed at the small hole 96. For those making conduction by a diffusion junction of metallic particles, metal in upper and lower electric conductive compositions in the small hole 96 has a mutually diffusion-bonded state.

Figure 33:
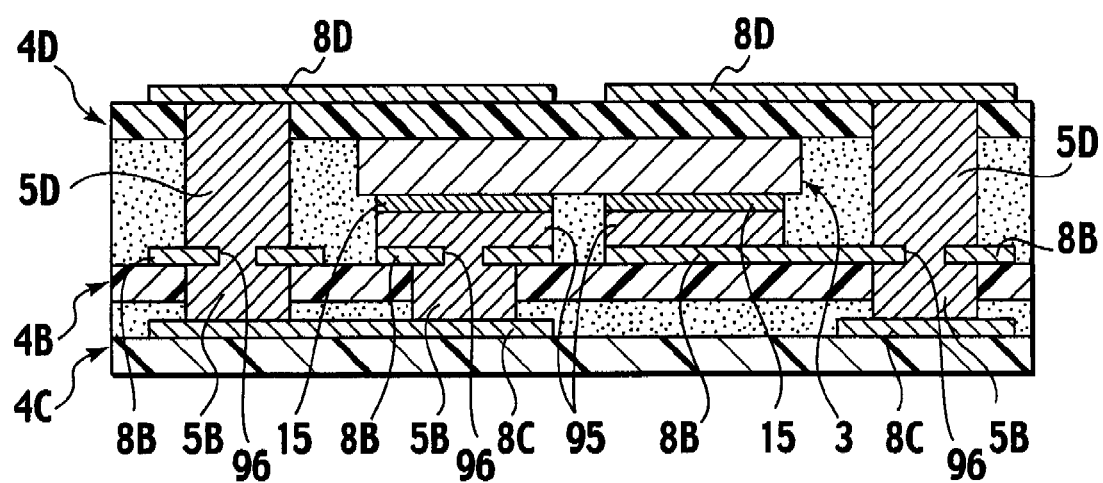
FIG. 33 is a configuration illustrating sectional view of a printed wiring board according to another embodiment of the present invention.

FIG. 33 illustrates a printed wiring board in which an electric conductive layer 15 of an IC chip 3 is connected on a circuit pattern (via land) 8B of a wired base material 8B, with an electric conductive paste 95 in between, and a wired base material 4D is laminated on the wired base material 8B, thus having a built-in structure of IC chip 3. The wired base material 4D has a plugging electrode 5D. It is noted that no small hole is formed in its circuit pattern 8D. Further, a wired base material 4C has a circuit pattern 8C formed thereon, which has no small holes formed therein, either. The wired base material 4B and the wired base material 4D have plugging electrodes 5B, 5D integrated together through a small hole 96 formed in the circuit pattern 8B. The embodiment illustrated in FIG. 33 has a structure in which the plugging electrodes 5B, 5D are integrated together in a single column form, where the plugging electrodes 5B, 5D are mixed together or metal diffusion-bonded, implementing an interface-less continuous formation with high connection reliability. Likewise, also the connection between electric conductive layer 15 of IC chip 3 and circuit pattern (via land) 8B has high connection reliability. Further, plugging electrodes are vertically integrated through a small hole, thus allowing for an enhanced mechanical strength of printed wiring board.

The printed wiring boards illustrated in FIG. 32 and FIG. 33, as well as the embodiments described, allow electronic components to be bonded or mounted with highly reliable connections by a simple and facile process of laminating wired base materials.

INDUSTRIAL APPLICABILITY

According to the present invention, a printed wiring board has possible applications to a variety of fields of manufacture of electronics such as mobile phones, mobile electronics, household appliances, and medical devices.

The invention claimed is:

1. A method of manufacturing a printed wiring board, comprising:
   a set of steps of forming a via hole in an insulating base material made of a resin having a thermal plasticity or a thermo-set resin in a partially cured state and having an electric conductive layer formed on one side thereof, and filling the via hole with an electric conductive paste in a printing manner to make a plugging electrode;
   a set of steps of positioning, to the plugging electrode, a re-wiring portion of a semiconductor device having the re-wiring portion connected to an electrode formed on a semiconductor board, and provisionally joining the semiconductor device to an adhesion layer of the insulating base material by a thermo-compression bonding; and
   a step of performing an adhesive bonding between insulating base materials, an adhesive bonding of the insulating base material and the semiconductor device, and a hardening of the electric conductive paste to make the plugging electrode, by a hot pressing as a single step.

2. A method of manufacturing a printed wiring board, comprising:
   a set of steps of forming a via hole in an insulating base material having an electric conductive layer on one side thereof and an adhesion layer as another side thereof, and filling the via hole with an electric conductive paste in a printing manner to make a plugging electrode;
   a set of steps of positioning to the plugging electrode a re-wiring portion of a semiconductor device having the re-wiring portion connected to an electrode formed on a semiconductor board, and provisionally joining the semiconductor device to the adhesion layer of the insulating base material by a thermo-compression bonding; and
   a step of performing an adhesive bonding between insulating base materials, an adhesive bonding of the insulating base material and the semiconductor device, and a hardening of the electric conductive paste to make the plugging electrode, by a hot pressing as a single step.

3. A method of manufacturing a printed wiring board, comprising:
   a set of steps of forming a via hole in an insulating base material made of a resin having a thermal plasticity or a thermo-set resin in a partially cured state and having an electric conductive layer formed on one side thereof, and filling the via hole with an electric conductive paste in a printing manner to make a plugging electrode;
   a set of steps of positioning to the plugging electrode a re-wiring portion of a semiconductor device having the re-wiring portion connected to an electrode formed on a semiconductor board, disposing a supporting board formed with an adhesion layer on an opposite side to the re-wiring portion of the semiconductor device, with the adhesion layer brought into contact thereon, and provisionally joining the semiconductor device to an adhesion layer of the insulating base material by a thermo-compression bonding; and a step of performing an adhesive bonding between insulating base materials, an adhesive bonding of the insulating base material and the semiconductor device, and a hardening of the electric conductive paste to make the plugging electrode, by a hot pressing as a single step.

4. A method of manufacturing a printed wiring board, comprising:
- a set of steps of forming a via hole in an insulating base material having an electric conductive layer on one side thereof and an adhesion layer as another side thereof, and filling the via hole with an electric conductive paste in a printing manner to make a plugging electrode;
- a set of steps of positioning to the plugging electrode a re-wiring portion of a semiconductor device having the re-wiring portion connected to an electrode formed on a semiconductor substrate, disposing a supporting board formed with an adhesion layer on an opposite side to the re-wiring portion of the semiconductor device, with this adhesion layer brought into contact thereon, and provisionally joining the semiconductor device to the adhesion layer of the insulating base material by a thermo-compression bonding; and
- a step of performing an adhesive bonding between insulating base materials, an adhesive bonding of the insulating base material and the semiconductor device, and a hardening of the electric conductive paste to make the plugging electrode, by a hot pressing as a single step.

5. A method of manufacturing a printed wiring board, comprising:
- a set of steps of forming a via hole in an insulating base material made of a resin having a thermal plasticity or a thermo-set resin in a partially cured state and having an electric conductive layer formed on one side thereof, and filling the via hole with an electric conductive paste in a printing manner to make a plugging electrode;
- a set of steps of positioning to the plugging electrode a re-wiring portion of a semiconductor device having the re-wiring portion connected to an electrode formed on a semiconductor substrate, disposing a supporting board formed with an adhesion layer containing at least in part a heat conductive material of a heat conductivity of 0.4 W/m·K or more on an opposite side to the re-wiring portion of the semiconductor device, with the adhesion layer brought into contact thereon, and provisionally joining the semiconductor device to an adhesion layer of the insulating base material by a thermo-compression bonding; and
- a step of performing an adhesive bonding between insulating base materials, an adhesive bonding of the insulating base material and the semiconductor device, and a hardening of the electric conductive paste to make the plugging electrode, by a hot pressing as a single step.

6. A method of manufacturing a printed wiring board, comprising:
- a set of steps of forming a via hole in an insulating base material having an electric conductive layer on one side thereof and an adhesion layer as another side thereof, and filling the via hole with an electric conductive paste in a printing manner to make a plugging electrode;
- a set of steps of positioning to the plugging electrode a re-wiring portion of a semiconductor device having the re-wiring portion connected to an electrode formed on a semiconductor substrate, disposing a supporting board formed with an adhesion layer containing at least in part a heat conductive material of a heat conductivity of 0.4 W/m·K or more on an opposite side to the re-wiring portion of the semiconductor device, with this adhesion layer brought into contact thereon, and provisionally joining the semiconductor device to the adhesion layer of the insulating base material by a thermo-compression bonding; and
- a step of performing an adhesive bonding between insulating base materials, an adhesive bonding of the insulating base material and the semiconductor device, and a hardening of the electric conductive paste to make the plugging electrode, by a hot pressing as a single step.

7. A method of manufacturing a printed wiring board, comprising:
- a set of steps of forming a via hole in a first insulating base material having an electric conductive layer on one side thereof and filling the via hole with an electric conductive paste in a printing manner to make a plugging electrode;
- a set of steps of positioning, to the plugging electrode, a re-wiring portion of a semiconductor device having the re-wiring portion connected to an electrode formed on a semiconductor substrate, and provisionally joining, by a thermo-compression bonding, the semiconductor device to the first insulating base material, with an interlayer binding material in between;
- a set of steps of forming a via hole in a second insulating base material having an electric conductive layer on another side thereof, and filling this via hole with an electric conductive paste in a printing manner to make a plugging electrode;
- a step of laminating the second insulating base material to the first insulating base material, with an interlayer binding material in between, having the semiconductor device interposed between the insulating base materials, bringing the plugging electrodes of the insulating base materials into contact with each other; and
- a step of performing an adhesive bonding by the interlayer binding materials, and a hardening of the electric conductive pastes to make the plugging electrodes, by a hot pressing as a single step.

8. The method of manufacturing a printed wiring board as claimed in claim 7, comprising a step of laminating the second wired base material to the first wired base material, with an interlayer binding material in between, including
- disposing a third insulating base material having a substantially identical thickness to the semiconductor device, within a region excepting an installation region of the semiconductor device, and interposing the third insulating base material, together with the semiconductor device, between the first wired base material and the second wired base material.

* * * * *